United States Patent
Osada

(10) Patent No.: US 7,936,225 B2
(45) Date of Patent: *May 3, 2011

(54) VOLTAGE CONTROLLED OSCILLATOR CIRCUIT, PHASE-LOCKED LOOP CIRCUIT USING THE VOLTAGE CONTROLLED OSCILLATOR CIRCUIT, AND SEMICONDUCTOR DEVICE PROVIDED WITH THE SAME

(75) Inventor: Takeshi Osada, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 38 days.

This patent is subject to a terminal disclaimer.

(21) Appl. No.: 12/333,665

(22) Filed: Dec. 12, 2008

(65) Prior Publication Data

US 2009/0096534 A1 Apr. 16, 2009

Related U.S. Application Data

(63) Continuation of application No. 11/498,810, filed on Aug. 4, 2006, now Pat. No. 7,466,208.

(30) Foreign Application Priority Data

Aug. 11, 2005 (JP) .................. 2005-233239

(51) Int. Cl.
*H03K 3/03* (2006.01)
(52) U.S. Cl. ............. 331/57; 331/186; 331/34; 331/175
(58) Field of Classification Search .................... 331/16, 331/34, 57, 175, 177 R, 185, 186
See application file for complete search history.

(56) References Cited

U.S. PATENT DOCUMENTS

| | | | |
|---|---|---|---|
| 4,968,952 A | 11/1990 | Kehler, Jr. | |
| 5,133,064 A | 7/1992 | Hotta et al. | |
| 5,359,727 A | 10/1994 | Kurita et al. | |

(Continued)

FOREIGN PATENT DOCUMENTS

JP 2001-024485 1/2001

(Continued)

OTHER PUBLICATIONS

International Search Report (Application No. PCT/JP2006/315355) Dated Aug. 29, 2006.

(Continued)

*Primary Examiner* — Robert Pascal
*Assistant Examiner* — Ryan Johnson
(74) *Attorney, Agent, or Firm* — Eric J. Robinson; Robinson Intellectual Property Law Office, P.C.

(57) ABSTRACT

A VCO circuit includes: a control portion to which a first voltage is inputted and from which a second voltage corresponding to the first voltage is outputted; a current source portion to which the second voltage is inputted and from which a current corresponding to the second voltage is outputted; and an oscillator circuit to which the current is inputted and from which a signal with a frequency in accordance with the current is outputted. The control portion includes an adjusting circuit which changes the second voltage in conjunction with fluctuation of a power supply voltage. Accordingly, fluctuation of the frequency Fo of an output signal of the VCO circuit can be suppressed even when the power supply voltage of the VCO circuit fluctuates.

19 Claims, 23 Drawing Sheets

U.S. PATENT DOCUMENTS

| | | | |
|---|---|---|---|
| 5,594,391 A | 1/1997 | Yoshizawa | |
| 5,731,727 A | 3/1998 | Iwamoto et al. | |
| 5,956,378 A | 9/1999 | Soda | |
| 6,563,387 B2 | 5/2003 | Hirano et al. | |
| 6,664,861 B2 | 12/2003 | Murakami | |
| 7,023,283 B2 | 4/2006 | Kawasumi et al. | |
| 7,466,208 B2 * | 12/2008 | Osada | 331/57 |
| 2005/0088247 A1 | 4/2005 | Yasui | |

FOREIGN PATENT DOCUMENTS

| | | |
|---|---|---|
| JP | 2001-251186 | 9/2001 |
| JP | 2005-130092 | 5/2005 |

OTHER PUBLICATIONS

Written Opinion (Application No. PCT/JP2006/315355) Dated Aug. 29, 2006.

* cited by examiner

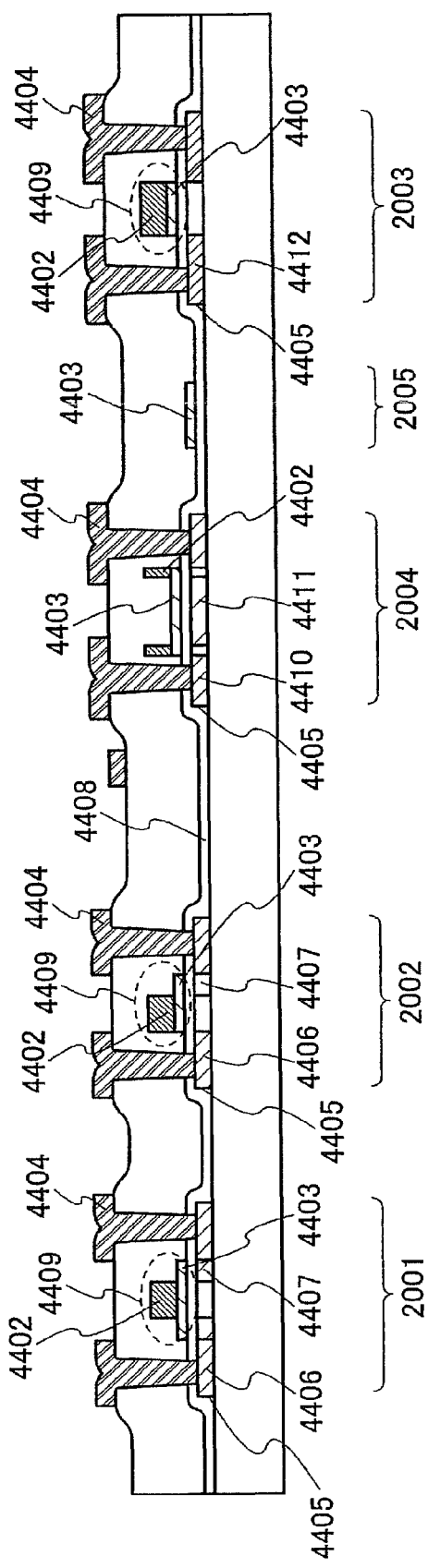

VOLTAGE CONTROLLED OSCILLATOR CIRCUIT, PHASE-LOCKED LOOP CIRCUIT USING THE VOLTAGE CONTROLLED OSCILLATOR CIRCUIT, AND SEMICONDUCTOR DEVICE PROVIDED WITH THE SAME

TECHNICAL FIELD

The present invention relates to a voltage controlled oscillator circuit, and a clock generation circuit using the voltage controlled oscillator circuit. Further, the present invention relates to a semiconductor device provided with the clock generation circuit. In particular, the present invention relates to a phase-locked loop circuit as the clock generation circuit.

BACKGROUND OF THE INVENTION

In recent years, a semiconductor in which various circuits are integrated on the same insulating surface has been developed, and a phase-locked loop circuit (hereinafter, a PLL circuit) is known as a circuit of generating a clock with an arbitrary frequency synchronized with a supplied signal.

A PLL circuit includes a voltage controlled oscillator circuit (hereinafter, a VCO circuit) and compares a phase of a supplied signal with that of a feedback signal which is an output of the VCO circuit. Then, the PLL circuit adjusts an output signal by negative feedback so that the supplied signal and the feedback signal can maintain a fixed phase relationship between the signals.

In the VCO circuit, a frequency Fo of an output signal is controlled by an input voltage (hereinafter, also referred to as a control voltage of the VCO circuit) Vin (note that a voltage refers to a potential difference from a ground unless particularly described), and a relationship between the input voltage and the output frequency is changed by fluctuation of a power supply voltage. Therefore, by providing a constant voltage circuit in the VCO circuit, stable phase synchronization of the PLL circuit is achieved. However, a voltage to be generated by the constant voltage circuit fluctuates by fluctuation in a manufacturing condition such as a process. When the voltage to be generated by the constant voltage circuit fluctuates, the relationship between the input voltage Vin of the VCO circuit and the frequency Fo of the output signal fluctuates. Further, when the relationship between the input voltage Vin of the VCO circuit and the frequency Fo of the output signal fluctuates, the PLL circuit using the VCO circuit may not perform such an operation that a frequency of an output signal thereof (a free-running oscillation frequency) is made a desired frequency (hereinafter, also called locking with a desired frequency). Therefore, the range of the power supply voltage of the VCO circuit, which is capable of phase synchronization with the signal supplied to the PLL circuit, is required to be sufficiently enlarged.

As a measure against the foregoing problem, there is a method of enlarging the frequency range of an output signal of the VCO circuit. This can ensure that the PLL circuit locks with the desired frequency regardless of fluctuation of a power supply voltage due to various causes.

Variable range of the frequency Fo of the output signal with respect to the input voltage Vin of the VCO circuit is enlarged. Therefore, change rate (hereinafter, a frequency control voltage gain) of the frequency Fo of the output signal with respect to the input voltage Vin (hereinafter, also called a control voltage) becomes steep. As the frequency control voltage gain increases, the fluctuation of the frequency Fo of the output signal is increased even with respect to slight fluctuation of the control voltage, which gives an adverse effect on characteristics, such as a jitter (: fluctuation in delay time of a signal or the like).

In such a situation, for stable locking regardless of fluctuation of the operating condition and the manufacturing condition of a circuit, a PLL circuit is proposed in which a plurality of VCO circuits is provided, respective frequency ranges of output signals of the plurality of VCO circuits are set to different ranges, and the most suitable VCO circuit is selected from the plurality of VCO circuits (see Patent Document 1: Japanese Patent Laid-Open No. 2001-251186).

However, in the conventional PLL circuit, it is required to provide a plurality of VCO circuits, and to provide a selection circuit for selecting the most suitable VCO circuit. Therefore, there is a disadvantage in that circuit size is increased. In addition, since the frequency ranges of the output signals of the plurality of VCO circuits are discrete, locking of the PLL circuit may be unstable in the boundary of the frequency ranges.

BRIEF SUMMARY OF THE INVENTION

In view of the above, it is an object of the present invention to provide a VCO circuit of which fluctuation of the frequency Fo of an output signal is small even when a power supply voltage fluctuates. In addition, it is an object of the present invention to provide a PLL circuit in which a free-running oscillation frequency can be adjusted to be constant even when the power supply voltage of the VCO circuit fluctuates, so that stable locking can be realized. Further, it is an object of the present invention to provide a semiconductor device provided with the PLL circuit.

A voltage controlled oscillator circuit (VCO circuit) of the invention includes a control portion to which a first voltage is inputted and from which a second voltage corresponding to the first voltage is outputted, a current source portion to which the second voltage is inputted and from which a current corresponding to the second voltage is outputted, and an oscillator circuit to which the current is inputted and from which a signal with a frequency in accordance with the current is outputted, in which the control portion includes an adjusting circuit, and the adjusting circuit changes the second voltage in conjunction with fluctuation of a power supply voltage.

The adjusting circuit decreases the second voltage when the power supply voltage increases whereas increases the second voltage when the power supply voltage decreases.

A more specific structure of the control portion is as follows.

(First Structure of the Control Portion)

The control portion includes a first transistor, a second transistor, and a third transistor connected in series with the first transistor. The adjusting circuit includes the second transistor. As for the third transistor, a gate and a drain are connected (: hereinafter, called diode-connection). A current flowing through a source and the drain (hereinafter called a drain current) of the third transistor is the sum of a drain current of the first transistor and a drain current of the second transistor. The first voltage is inputted to a gate of the first transistor. The second voltage is outputted from a drain of the first transistor. A third voltage is inputted to a gate of the second transistor. The third voltage changes in conjunction with fluctuation of the power supply voltage.

The second transistor forms a constant current source of supplying a constant current in accordance with the third voltage.

In particular, both of the first transistor and the second transistor are n-channel transistors, and the third voltage decreases when the power supply voltage is increased whereas the third voltage increases when the power supply voltage is decreased. That is, the third voltage changes so as to decrease the drain current of the second transistor when the power supply voltage is increased, whereas the third voltage changes so as to increase the drain current of the second transistor when the power supply voltage is decreased.

In addition, by changing a rate of the drain current of the second transistor with respect to the drain current of the first transistor, a current gain is adjusted. The current gain refers to the amount of change of a current I which flows through the VCO circuit with respect to change of the input voltage Vin of the VCO circuit.

In the first structure of the control portion, a fourth transistor which forms a current mirror circuit together with the third transistor, and a fifth transistor which is connected in series with the fourth transistor and is diode-connected may be further included. Note that conductivity types of the transistors which form the current mirror circuit are the same, gate voltages of the transistors are equal, and so are drain voltages thereof.

(The Second Structure of the Control Portion)

The control portion includes a first transistor, a second transistor, a third transistor connected in series with the first transistor, a fourth transistor, and a fifth transistor connected in series with the fourth transistor. The adjusting circuit includes the second transistor. The third transistor is diode-connected. The fifth transistor is diode-connected. The first transistor and the fifth transistor form a current mirror circuit. A drain current of the third transistor is the sum of a drain current of the first transistor and a drain current of the second transistor. The first voltage is inputted to a gate of the fourth transistor. The second voltage is outputted from a drain of the first transistor. A third voltage is inputted to a gate of the second transistor. The third voltage changes in conjunction with fluctuation of the power supply voltage.

The second transistor forms a constant current source of supplying a constant current in accordance with the third voltage.

In particular, both of the first transistor and the second transistor are p-channel transistors, and the third voltage increases when the power supply voltage is increased whereas the third voltage decreases when the power supply voltage is decreased. That is, the third voltage changes so as to decrease the drain current of the second transistor when the power supply voltage is increased, whereas the third voltage changes so as to increase the drain current of the second transistor when the power supply voltage is decreased.

In addition, by changing a rate of the drain current of the second transistor with respect to the drain current of the first transistor, a current gain is adjusted.

In the second structure of the control portion, a sixth transistor which forms a current mirror circuit together with the third transistor, and a seventh transistor which is connected in series with the sixth transistor and is diode-connected may be further included.

The above is the more specific structures of the control portion.

Note that the present invention can provide a phase-locked loop circuit (PLL circuit) using the above-described voltage controlled oscillator circuit. For example, the invention can have a structure including the above-described voltage controlled oscillator circuit, a frequency divider, a phase comparator, and a loop filter.

A reference signal and an output of the frequency divider are inputted to the phase comparator, and the phase comparator outputs a phase difference between the reference signal and an output signal of the frequency divider. An output of the phase comparator is inputted to the loop filter, and the loop filter removes noise (mainly, a high-frequency component) of the inputted signal to output. An output signal of the loop filter is inputted to the voltage controlled oscillator circuit. An output of the voltage controlled oscillator circuit is inputted to the frequency divider, and the frequency divider decreases the frequency of the inputted signal to 1/N times (N is an arbitrary natural number) to output.

Further, the present invention can provide a semiconductor device provided with the phase-locked loop circuit (PLL circuit). For example, as a semiconductor device, the invention can be applied to a semiconductor device of performing wireless transmission/reception of data. As such a semiconductor device, there are a wireless chip (also called a wireless tag, an IC tag, an IC chip, an RF (Radio Frequency) tag, an RFID tag, an electronic tag, or a transponder), a mobile phone, a cordless phone, a wireless LAN, and the like.

The VCO circuit of the invention can suppress fluctuation of the frequency Fo of an output signal even when a power supply voltage fluctuates since the adjusting circuit is included. In addition, the PLL circuit of the invention can adjust the free-running oscillation frequency to be constant even when the power supply voltage of the VCO circuit fluctuates, so that stable locking can be realized.

BRIEF DESCRIPTION OF THE SEVERAL VIEWS OF THE DRAWINGS

FIG. 17 shows Embodiment 3.

DETAILED DESCRIPTION OF THE INVENTION

Figure 1:
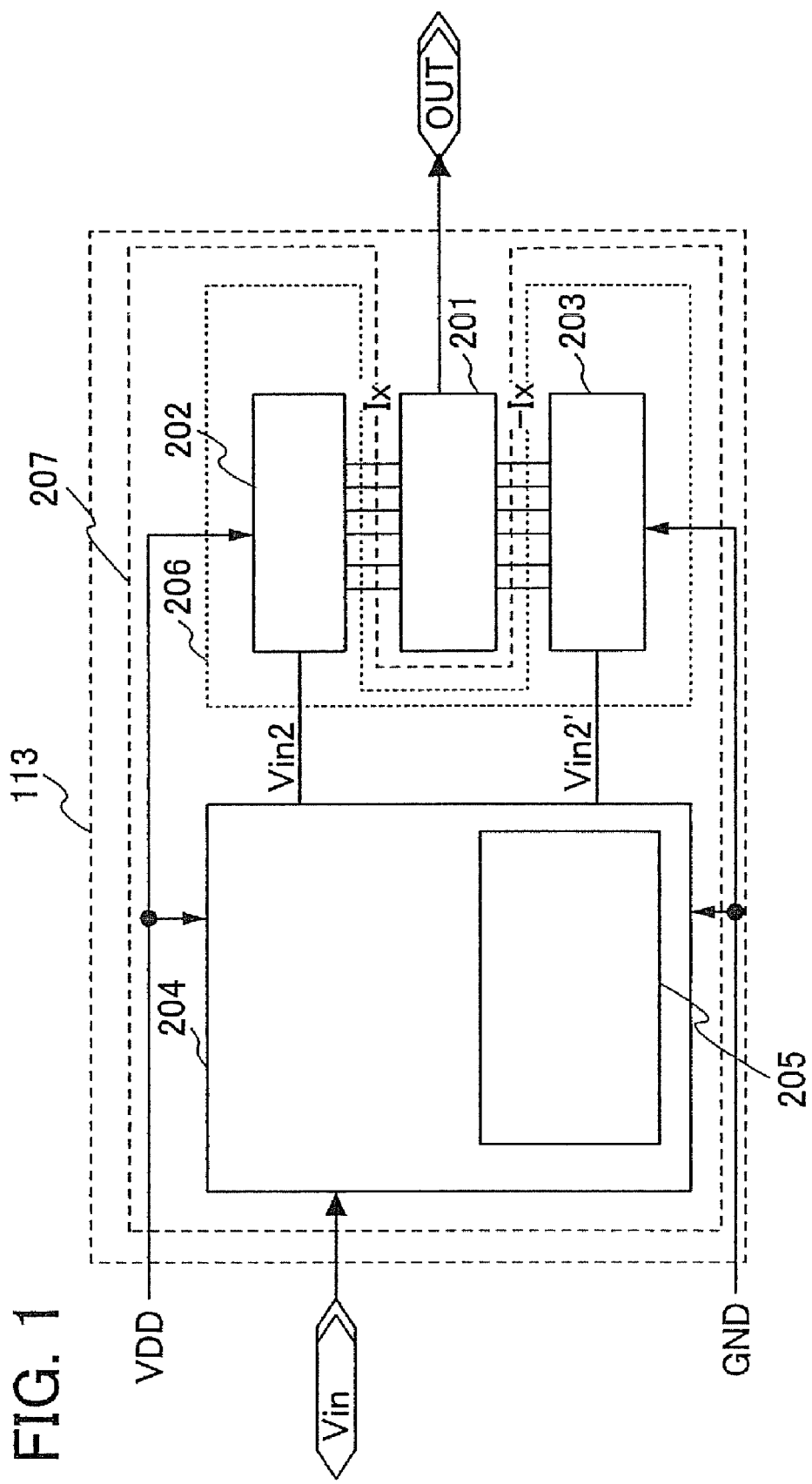
FIG. 1 shows a structure of Embodiment Mode 1.

Best Mode for Carrying Out the Invention

Although the invention will be described below by way of embodiment modes and embodiments with reference to the accompanying drawings, it is to be understood that various changes and modifications will be apparent to those skilled in the art Therefore, unless such changes and modifications depart from the scope of the invention, they should be construed as being included therein. Note that identical portions are denoted by the same reference symbols in the drawings in a structure of the present invention described below. Connection also includes electrical connection.

Embodiment Mode 1

FIG. 1 is a block diagram of a voltage controlled oscillator circuit (a VCO circuit 113) of the invention. The VCO circuit 113 includes an oscillator circuit 201 and a voltage controlled current source 207. The voltage controlled current source 207 includes a control portion 204 and a current source portion 206. The current source portion 206 includes a circuit 202 formed of a p-channel transistor and a circuit 203 formed of an n-channel transistor. The control portion 204 includes an adjusting circuit 205.

A first voltage (denoted by Vim in FIG. 1) is inputted to the control portion 204, and the control portion 204 outputs a second voltage (denoted by Vin2 and Vin2' in FIG. 1) corresponding to the first voltage Vin. The second voltage (Vin2 and Vin2') is inputted to the current source portion 206, and the current source portion 206 outputs a current (denoted by Ix in FIG. 1) corresponding to the second voltage (Vin2 and Vin2'). Note that Vin2 is inputted to the circuit 202 formed of a p-channel transistor, and the circuit 202 outputs a current Ix, whereas Vin2' is inputted to the circuit 203 formed of an n-channel transistor, and the circuit 203 outputs a current −Ix. The current Ix and the current −Ix are inputted to the oscillator circuit 201, and the oscillator circuit 201 outputs a signal (denoted by OUT in FIG. 1) with a frequency corresponding to the current Ix and the current −Ix. The adjusting circuit 205 which is included in the control portion 204 changes the second voltage (Vin2 and Vin2') in conjunction with fluctuation of a power supply voltage VDD.

The adjusting circuit 205 decreases the second voltage Vin2 and increases the second voltage Vin2' when the power supply voltage VDD is increased, and increases the second voltage Vin2 and decreases the second voltage Vin2' when the power supply voltage VDD is decreased.

Although FIG. 1 shows the structure in which the circuit 202 formed of a p-channel transistor and the circuit 203 formed of an n-channel transistor are provided, the invention is not limited to this; only either one of the circuit 202 and the circuit 203 may be provided as well.

Embodiment Mode 2

This embodiment mode describes a more specific structure of the control portion 204 in the structure described in Embodiment Mode 1. Note that this embodiment mode corresponds to the first structure of the control portion that is described in BRIEF SUMMARY OF THE INVENTION.

Figure 2:
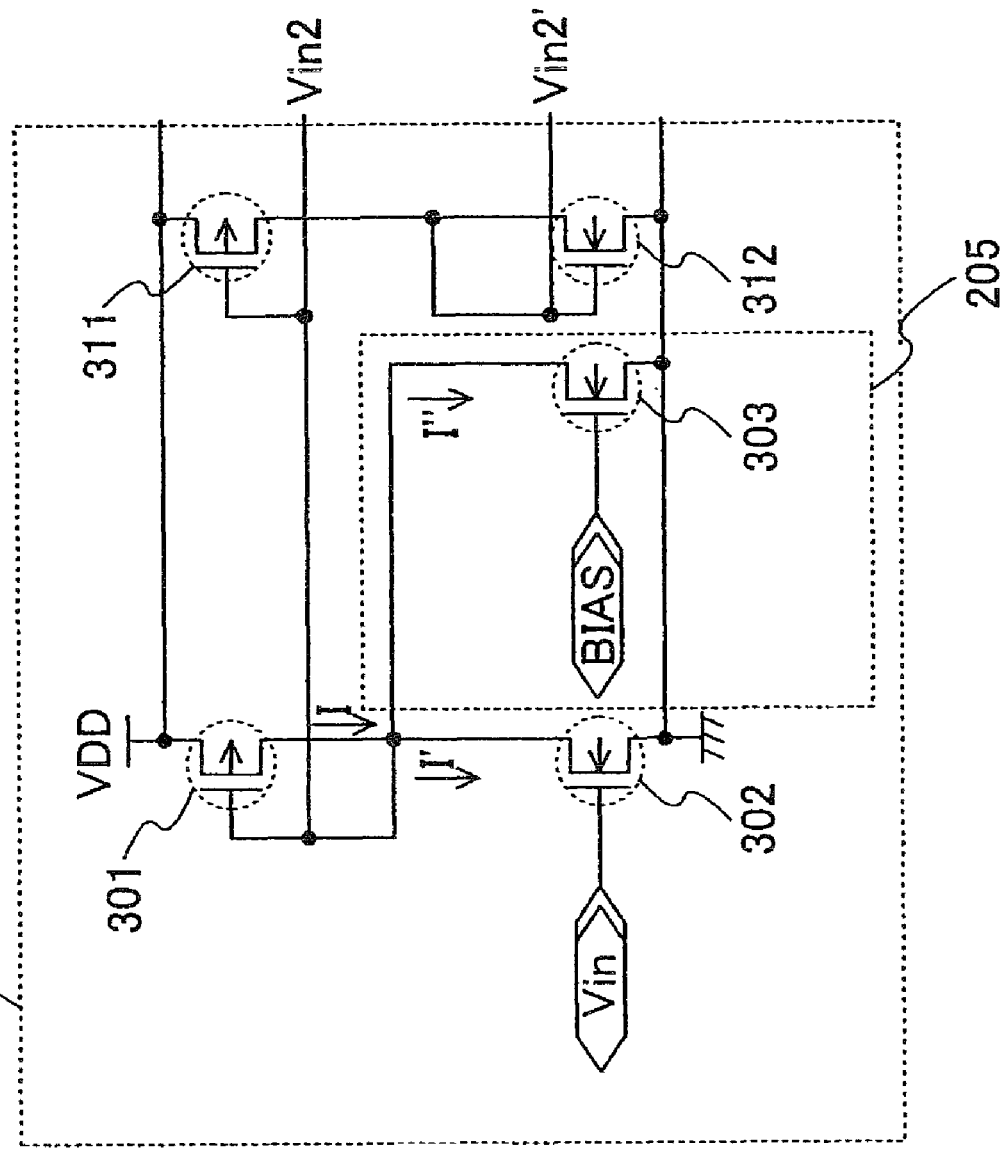
FIG. 2 shows a structure of Embodiment Mode 2.

FIG. 2 is a circuit diagram of the control portion 204. The control portion 204 includes a first transistor 302, a second transistor 303, and a third transistor 301 connected in series with the first transistor 302. Here, the adjusting circuit 205 which is included in the control portion 204 includes the second transistor 303. A gate and a drain of the third transistor 301 are diode-connected.

A drain current of the third transistor 301 is the sum of a drain current of the first transistor 302 and a drain current of the second transistor 303. A first voltage Vin is inputted to a gate of the first transistor 302. A drain of the first transistor 302 outputs a second voltage Vin2. A third voltage (denoted by BIAS in FIG. 2) is inputted to a gate of the second transistor 303. The second transistor 303 forms a constant current source of supplying a constant current in accordance with the third voltage BIAS. The third voltage BIAS changes in conjunction with fluctuation of a power supply voltage VDD.

Note that the power supply voltage VDD refers to a potential difference of a high power supply potential (denoted by VDD in the figure) with respect to a low power supply potential. GND is used as the low power supply potential in the figure. Hereinafter, the power supply voltage is denoted merely by VDD. Needless to say, the low power supply potential is not limited to GND, and an arbitrary potential lower than VDD may be used as well.

Both of the first transistor 302 and the second transistor 303 are n-channel transistors, and the third voltage BIAS decreases when the power supply voltage VDD is increased whereas the third voltage BIAS increases when the power supply voltage VDD is decreased. That is, the third voltage BIAS changes so as to decrease the drain current of the second transistor 303 when the power supply voltage VDD is increased, whereas the third voltage BIAS changes so as to increase the drain current of the second transistor 303 when the power supply voltage VDD is decreased.

The drain current (denoted by I in FIG. 2) of the third transistor 301 in FIG. 2 is determined in response to a desired frequency of an output signal of the VCO circuit 113. Therefore, the sum of the drain current (: a variable current which is denoted by I' in FIG. 2) of the first transistor 302 and the drain current (: a constant current which is denoted by I" in FIG. 2) of the second transistor 303 is a constant value I (: I=I'+I") at the desired output frequency.

A current gain of the VCO circuit 113 in the case of the predetermined power supply voltage VDD can be adjusted by changing a rate of the drain current of the second transistor 303 with respect to the drain current of the first transistor 302. The current gain refers to the amount of change of the current I with respect to change of the input voltage Vin of the VCO circuit 113 in the case of the predetermined power supply voltage VDD. By adjusting design of the first transistor 302 (design related to the drain current, such as channel width or channel length), the variable current I' is changed so that the current gain of the VCO circuit 113 can be adjusted. Further, by adjusting design of the second transistor 303 (design related to the drain current, such as channel width or channel length), the constant current I" is changed so that the frequency Fo of the output signal of the VCO circuit 113 can be adjusted to be a desired frequency.

In the control portion 204 shown in FIG. 2, a fourth transistor 311 which forms a current mirror circuit, together with the third transistor 301, and a fifth transistor 312 which is connected in series with the fourth transistor 311 and is diode-connected may be further included. Accordingly, the control portion 204 outputs the second voltage Vin2 and a voltage Vin2' corresponding to the second voltage Vin2.

In the control portion 204 in the structure shown in FIG. 2, the current mirror circuit is formed of only the fourth transistor 311 together with the third transistor 301; however, the invention is not limited to his. A plurality of transistors which forms a current mirror circuit together with the third transistor 301 may be provided and to each of the plurality of transistors, a diode-connected transistor which is connected in series may be provided. That is, a pair of the fourth transistor 311 and the fifth transistor 312 in FIG. 2 may be provided in plural numbers.

This embodiment mode can be implemented freely combining with Embodiment Mode 1.

Embodiment Mode 3

This embodiment mode describes another example of the more specific structure of the control portion 204 in the structure described in Embodiment Mode 1, which is different from the structure shown in FIG. 2 in Embodiment Mode 2. Note that this embodiment mode corresponds to the second structure of the control portion that is described in BRIEF SUMMARY OF THE INVENTION.

Figure 3:
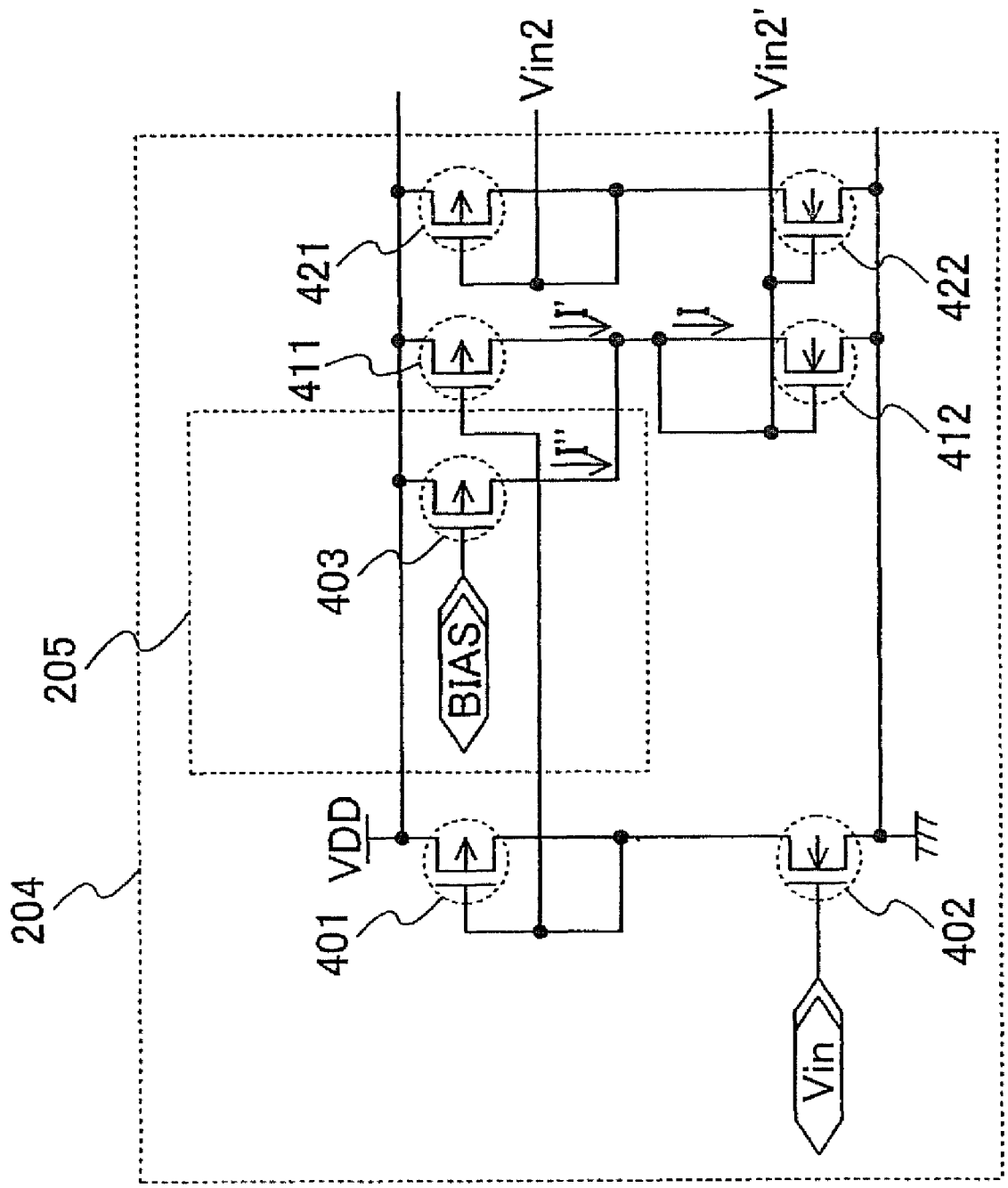
FIG. 3 shows a structure of Embodiment Mode 3.

FIG. 3 is a circuit diagram of the control portion 204. The control portion 204 includes a first transistor 411, a second transistor 403, a third transistor 412 connected in series with the first transistor 411, a fourth transistor 402, and a fifth transistor 401 connected in series with the fourth transistor 402. The adjusting circuit 205 includes the second transistor 403. The third transistor 412 is diode-connected. The fifth transistor 401 is diode-connected. The first transistor 411 and the fifth transistor 401 form a current mirror circuit.

A drain current of the third transistor 412 is the sum of a drain current of the first transistor 411 and a drain current of the second transistor 403. A first voltage Vin is inputted to a gate of the fourth transistor 402. A drain of the first transistor 411 outputs a second voltage Vin2'. A third voltage (denoted by BIAS in FIG. 3) is inputted to a gate of the second transistor 403. The second transistor 403 forms a constant current source of supplying a constant current in accordance with the third voltage BIAS. The third voltage BIAS changes in conjunction with fluctuation of a power supply voltage VDD.

Both of the first transistor 411 and the second transistor 403 are p-channel transistors, and the third voltage BIAS increases when the power supply voltage VDD is increased whereas the third voltage BIAS decreases when the power supply voltage VDD is decreased. That is, the third voltage BIAS changes so as to decrease the drain current of the second transistor 403 when the power supply voltage VDD is increased, whereas the third voltage BIAS changes so as to increase the drain current of the second transistor 403 when the power supply voltage VDD is decreased.

The drain current (denoted by I in FIG. 3) of the third transistor 412 in FIG. 3 is determined in response to a desired frequency of an output signal of the VCO circuit 113. Therefore, the sum of the drain current (: a variable current which is denoted by I' in FIG. 3) of the first transistor 411 and the drain current (: a constant current which is denoted by I'' in FIG. 3) of the second transistor 403 is a constant value I (: I=I'+I'') at the desired output frequency.

A current gain of the VCO circuit 113 in the case of the predetermined power supply voltage VDD can be adjusted by changing a rate of the drain current of the second transistor 403 with respect to the drain current of the first transistor 411. The current gain refers to the amount of change of the current I with respect to change of the input voltage Vin of the VCO circuit 113 in the case of the predetermined power supply voltage VDD. By adjusting design of the first transistor 411 (design related to the drain current, such as channel width or channel length), the variable current I' is changed so that the current gain of the VCO circuit 113 can be adjusted. Further, by adjusting design of the second transistor 403 (design related to the drain current, such as channel width or channel length), the constant current I'' is changed so that the frequency Fo of the output signal of the VCO circuit 113 can be adjusted to be a desired frequency.

In the control portion 204 shown in FIG. 3, a sixth transistor 422 which forms a current mirror circuit, together with the third transistor 412, and a seventh transistor 421 which is connected in series with the sixth transistor 422 and is diode-connected may be further included. Accordingly, the control portion 204 outputs the second voltage Vin2 and a voltage Vin2' corresponding to the second voltage Vin2.

In the control portion 204 in the structure shown in FIG. 3, the current mirror circuit is formed of only the sixth transistor 422 together with the third transistor 412; however, the invention is not limited to this. A plurality of transistors which forms a current mirror circuit, together with the third transistor 412 may be provided and to each of the plurality of transistors, a diode-connected transistor which is connected in series may be provided. That is, a pair of the sixth transistor 422 and the seventh transistor 421 in FIG. 3 may be provided in plural numbers.

This embodiment mode can be implemented freely combining with Embodiment Mode 1 or 2.

Embodiment Mode 4

Figure 4:
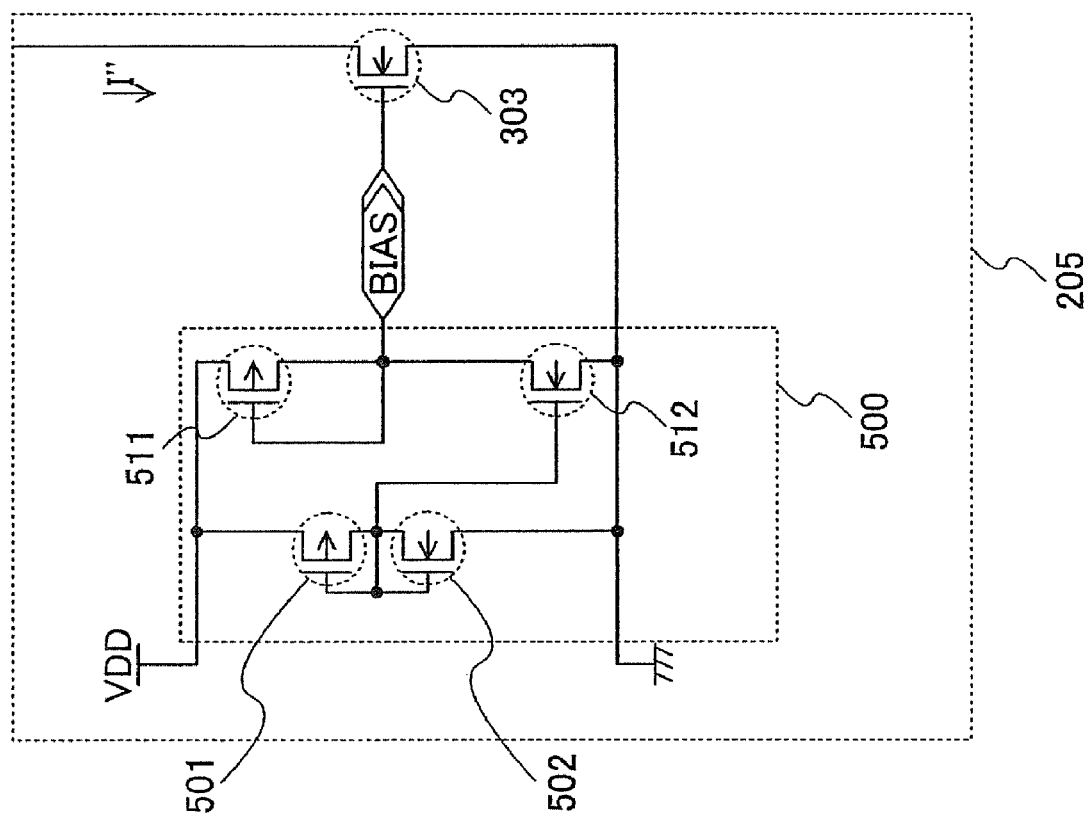
FIG. 4 shows a structure of Embodiment Mode 4.

This embodiment mode describes a further more specific structure of the adjusting circuit 205. In FIG. 4, the adjusting circuit 205 is shown. Description is made of the case where the third voltage BIAS is inputted to the gate of the transistor which is an n-channel transistor. That is, the case which corresponds to Embodiment Mode 2 is described. The adjusting circuit 205 includes a monitoring circuit 500 and the second transistor 303.

The monitoring circuit 500 includes p-channel transistors 501 and 511, and n-channel transistors 502 and 512. A gate and a drain of the p-channel transistor 501, a gate and a drain of the n-channel transistor 502, and a gate of the n-channel transistor 512 are connected. The high power supply potential VDD is supplied to a source of the p-channel transistor 501 and a source of the p-channel transistor 511. The low power supply potential (GND in the figure) is supplied to a source of the n-channel transistor 502 and a source of the n-channel transistor 512. The p-channel transistor 511 is diode-connected and is connected in series with the n-channel transistor 512. A voltage of a drain of the p-channel transistor 511 is inputted to the gate of the second transistor 303 as the third voltage BIAS.

This embodiment mode can be implemented freely combining with any of Embodiment Modes 1 to 3.

Embodiment Mode 5

This embodiment mode describes a frequency characteristic of the VCO circuit of the invention.

Figure 6:
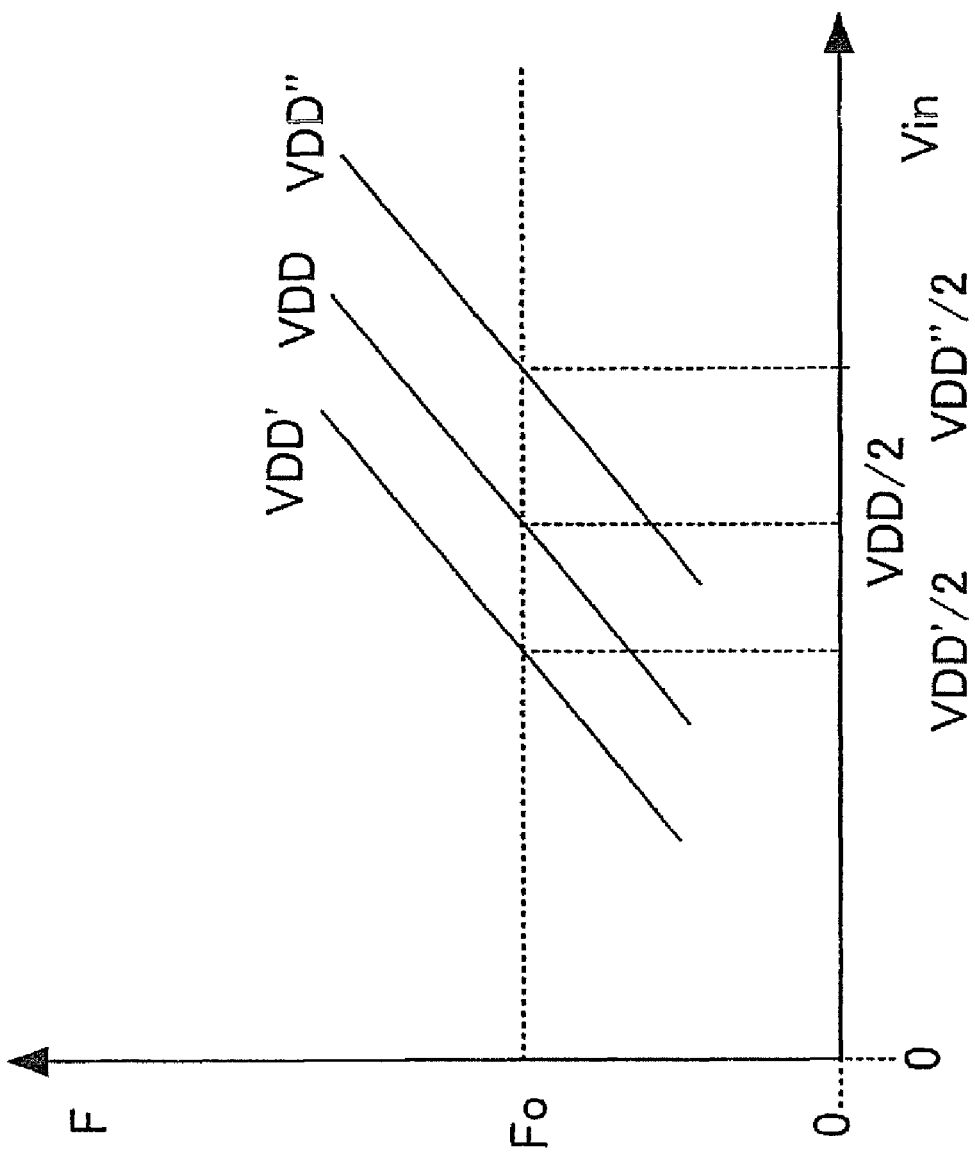
FIG. 6 shows Embodiment Mode 5.

First, an ideal frequency characteristic of the VCO circuit is shown in FIG. 6. Even in the case where the power supply voltage changes among VDD', VDD (>VDD'), and VDD'' (>VDD), a desired output frequency Fo can be obtained when the control voltage Vin is one half of the power supply voltage. In the adjusting circuit 205 shown in FIG. 4, when the current I'' of flowing to the second transistor 303 is increased, the frequency of the output signal of the VCO circuit 113 is increased. Thus, when the power supply voltage is decreased from VDD to VDD', the control voltage Vin for obtaining the output frequency Fo can be decreased from VDD/2 to VDD'/2 by increasing the current I''.

Figure 7:
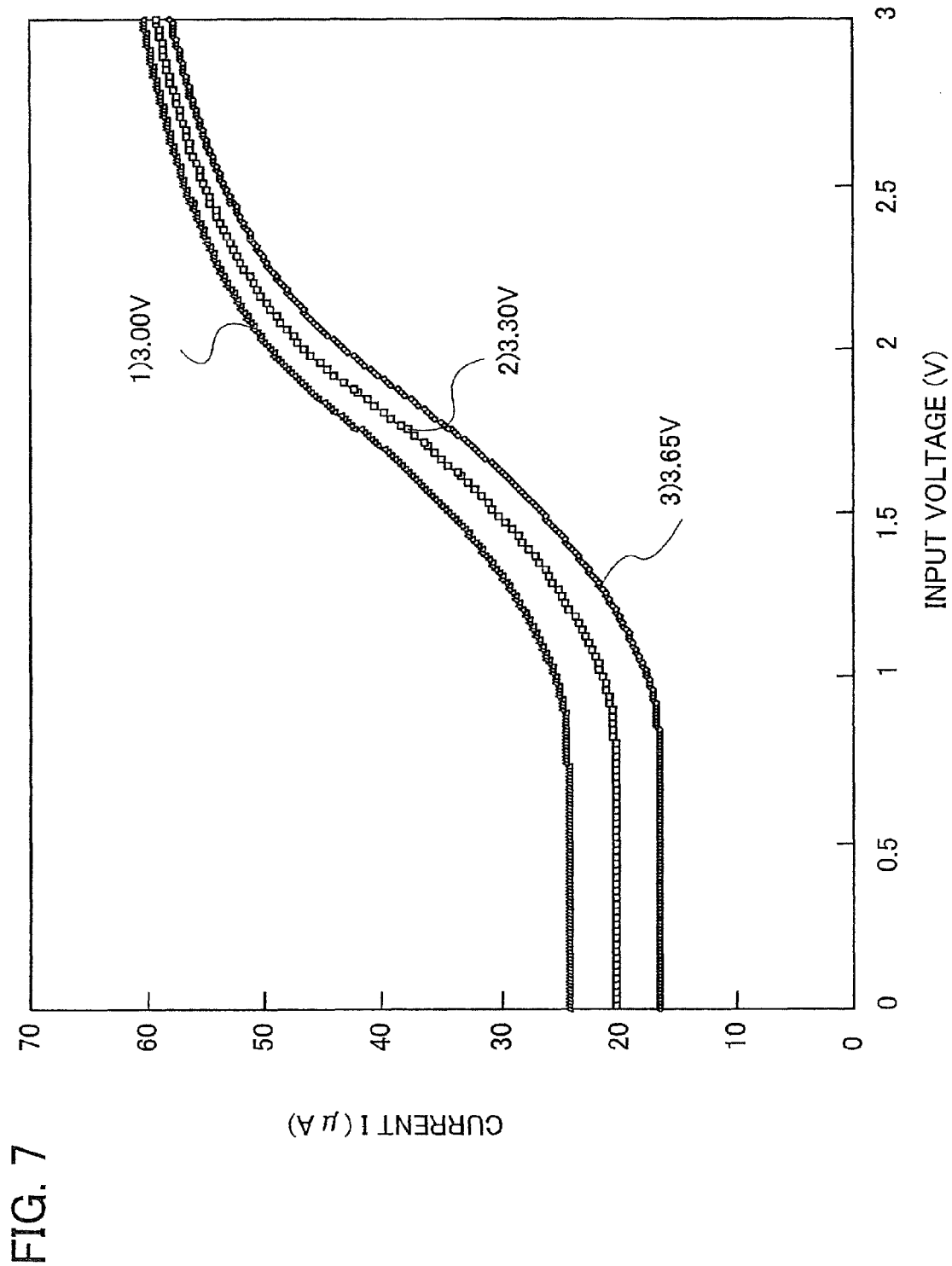
FIG. 7 shows Embodiment Mode 5.

FIG. 7 shows a characteristic of the current I of the VCO circuit of the invention using the adjusting circuit 205. The desired output frequency in the case where the current I is 35 μA is denoted by Fo. In a characteristic denoted by 2), the current I of 35 μA flows with an input voltage of 1.65 V in the case where the power supply voltage is 3.30 V. In order to obtain the desired output frequency Fo in the case where the power supply voltage is 3.00 V, a characteristic denoted by 1) is required. Therefore, by increasing the constant current I'', the characteristic of the VCO circuit is adjusted from 2) to 1). Similarly, adjustment from a characteristic denoted by 3) to 2) and adjustment from 3) to 1) are performed.

This embodiment mode can be implemented freely combining with any of Embodiment Modes 1 to 4.

Embodiment Mode 6

Figure 5:
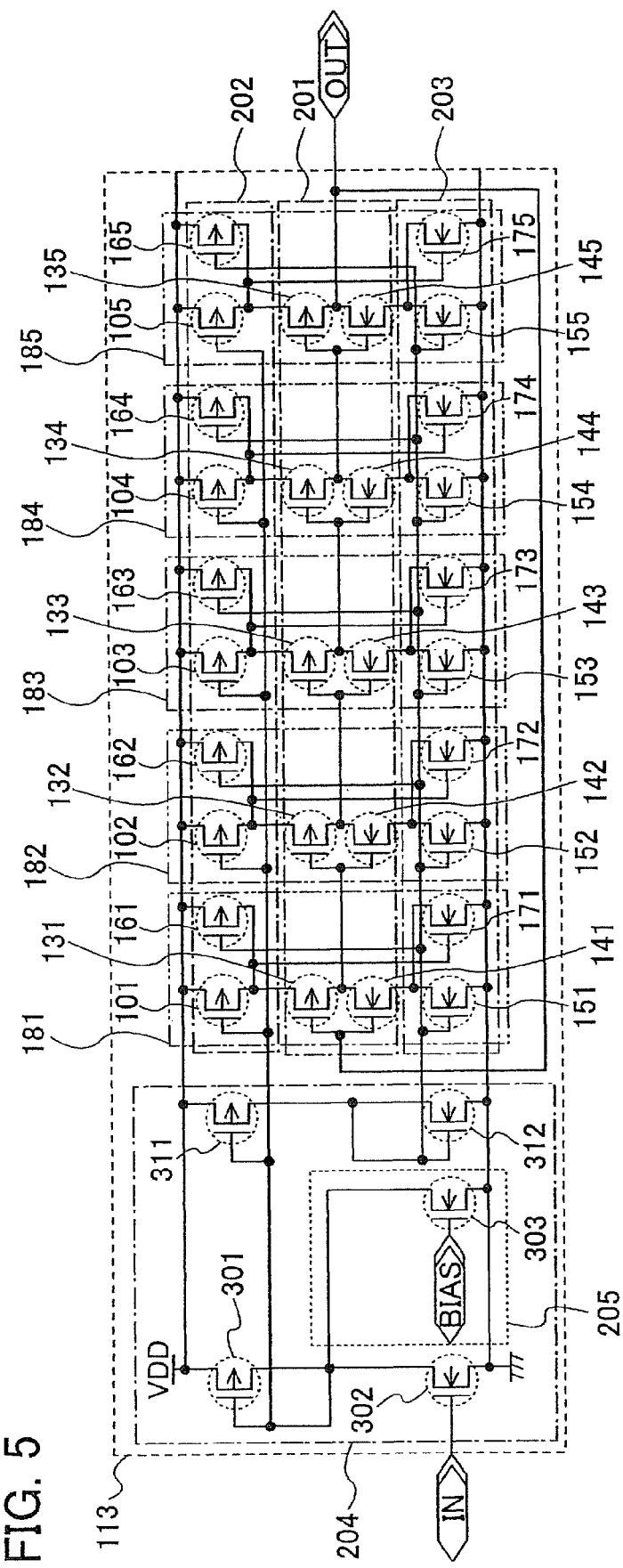
FIG. 5 shows a structure of Embodiment Mode 6.

This embodiment mode describes a more specific circuit configuration of the VCO circuit 113 with reference to FIG. 5. The VCO circuit 113 shown in FIG. 5 is one specific example of the circuit shown in the block diagram of FIG. 1.

The structure of the control portion 204 is the same as the structure described in Embodiment Mode 2 with reference to FIG. 2, thus description thereof is omitted.

In the oscillator circuit 201, an n-channel transistor 141 and a p-channel transistor 131 are connected in series with each other, and respective gates of the n-channel transistor 141 and the p-channel transistor 131 are connected to each other. Such a pair (an inverter circuit) of an n-channel transistor and a p-channel transistor is included in plural numbers (the n-channel transistor 141 and the p-channel transistor 131, an n-channel transistor 142 and a p-channel transistor 132, an n-channel transistor 143 and a p-channel transistor 133, an n-channel transistor 144 and a p-channel transistor 134, and an n-channel transistor 145 and a p-channel transistor 135). Although the oscillator circuit 201 in FIG. 5 has a structure in which five inverter circuits are connected in series, the invention is not limited to this. As for the plurality of inverters, an output of one inverter circuit is connected to an input of the subsequent inverter circuit, and an output of the inverter circuit of the last stage is connected to an input of the inverter circuit of the first stage, to form a loop structure. The number of the inverter circuits within the loop is odd so that the oscillator circuit 201 performs oscillation.

The current source portion 206 includes the circuit 202 formed of a p-channel transistor and the circuit 203 formed of an n-channel transistor. The circuit 202 formed of a p-channel transistor includes p-channel transistors 101, 102, 103, 104, 105, 161, 162, 163, 164, and 165. The circuit 203 formed of an n-channel transistor includes n-channel transistors 151, 152, 153, 154, 155, 171, 172, 173, 174, and 175.

A first stage 181 includes the n-channel transistor 141 and the p-channel transistor 131, the p-channel transistor 101, the p-channel transistor 161, the n-channel transistor 151, and the n-channel transistor 171. Similarly, a second stage 182 includes the n-channel transistor 142 and the p-channel transistor 132, the p-channel transistor 102, the p-channel transistor 162, the n-channel transistor 152, and the n-channel transistor 172. A third stage 183 includes the n-channel transistor 143 and the p-channel transistor 133, the p-channel transistor 103, the p-channel transistor 163, the n-channel transistor 153, and the n-channel transistor 173. A fourth stage 184 includes the n-channel transistor 144 and the p-channel transistor 134, the p-channel transistor 104, the p-channel transistor 164, the n-channel transistor 154, and the n-channel transistor 174. A fifth stage 185 includes the n-channel transistor 145 and the p-channel transistor 135, the p-channel transistor 105, the p-channel transistor 165, the n-channel transistor 155, and the n-channel transistor 175. In FIG. 5, a portion where the oscillator circuit 201, the circuit 202, and the circuit 203 are connected has a structure in which the first stage 181 to the fifth stage 185 are connected in series.

A connection relationship of transistors is the same in all the stages, therefore, that of the first stage 181 is described as a representative. Each of the p-channel transistors 101 and 161 is connected in series with the p-channel transistor 131. Each of the n-channel transistors 151 and 171 is connected in series with the n-channel transistor 141. The second voltage Vin2 is inputted to a gate of the p-channel transistor 101, and the second voltage Vin2' is inputted to a gate of the n-channel transistor 151. A gate of the p-channel transistor 161 is connected to a gate of the n-channel transistor 151, and a gate of the n-channel transistor 171 is connected to a drain of the p-channel transistor 101.

The portion where the oscillator circuit 201, the circuit 202, and the circuit 203 are connected has a structure in which the first stage 181 to the fifth stage 185 are connected in series in FIG. 5; however, the invention is not limited to this. A further large number of stages may also be included. It is necessary that the number of stages be odd.

This embodiment mode can be implemented freely combining with any of Embodiment Modes 1 to 5.

Embodiment Mode 7

Figure 8:
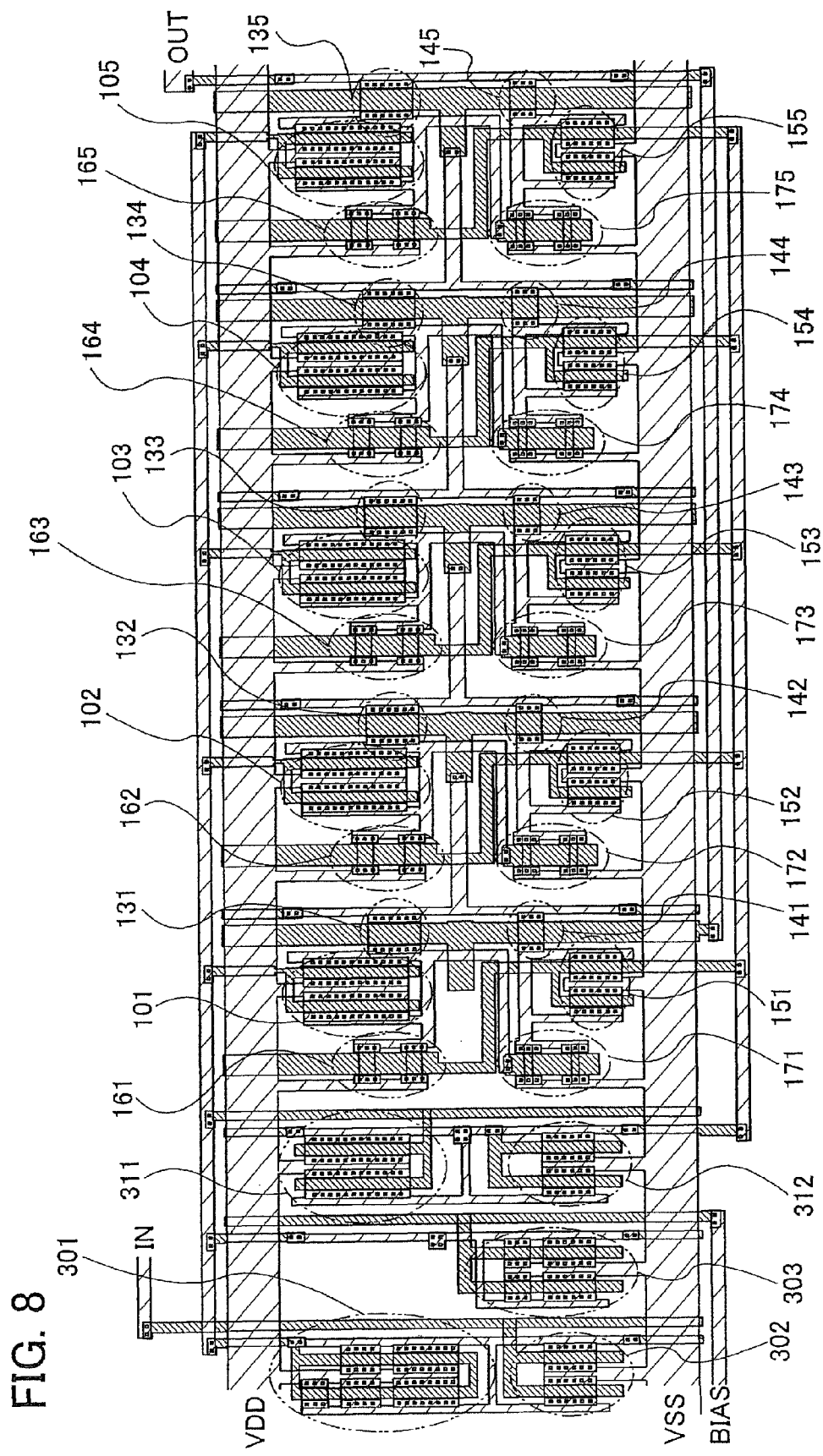
FIG. 8 shows a structure of Embodiment Mode 7.

This embodiment mode describes an example in which the VCO circuit having the structure described in Embodiment Mode 6 shown in FIG. 5 is actually manufactured. FIG. 8 is a mask diagram of the VCO circuit.

Note that the identical portions to those in FIG. 5 are denoted by the same reference symbols in FIG. 8, and description thereof is omitted. In FIG. 8, VSS is a low power supply potential which corresponds to GND in FIG. 5.

This embodiment mode can be implemented freely combining with any of Embodiment Modes 1 to 6.

Embodiment Mode 8

Figure 9:
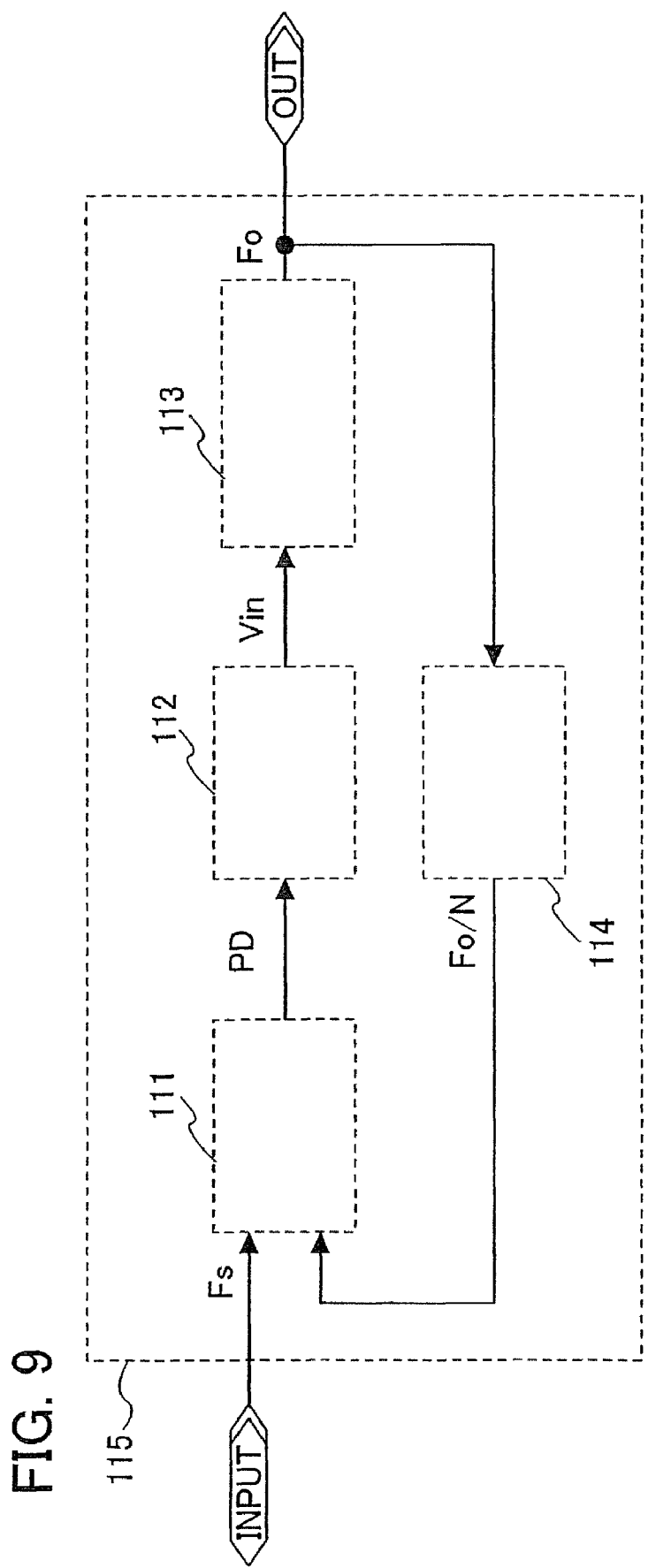
FIG. 9 shows a structure of Embodiment Mode 8.

This embodiment mode describes a structure of a PLL circuit provided with the VCO circuit 113 of the invention with reference to FIG. 9.

A phase-locked loop circuit (a PLL circuit 115) can have a structure including the VCO circuit 113, a frequency divider 114, a phase comparator 111, and a loop filter 112. The VCO circuit 113 can have the structure described in Embodiment Modes 1 to 7.

A reference signal (denoted by INPUT in FIG. 9) with a frequency Fs and an output of the frequency divider 114 are inputted to the phase comparator 111, and the phase comparator 111 outputs a phase difference (denoted by PD in FIG. 9) between the reference signal INPUT and an output signal of the frequency divider 114. An output of the phase comparator 111 is inputted to the loop filter 112, and the loop filter 112 removes a high-frequency component of the inputted signal to output. An output signal Vin of the loop filter 112 is inputted to the VCO circuit 113. An output (of which the frequency is denoted by Fo in FIG. 9) of the VCO circuit 113 is inputted to the frequency divider 114, and the frequency divider 114 decreases the frequency of the inputted signal to 1/N times (N is an arbitrary natural number) to output (of which the frequency is denoted by Fo/N in FIG. 9).

Note that the phase comparator 111, the loop filter 112, and the frequency divider 114 are provided as appropriate when required.

In addition, the phase comparator 111 which is theoretically a multiplier can be replaced by an analog phase comparator (e.g., a DBM: Double Balanced Mixer) or a digital phase comparator (e.g., an XOR, an RD flip-flop, or a current output circuit).

In addition, the loop filter 112 can be replaced by a passive loop filter (e.g., a low-pass filter or a lag-lead filter), an active loop filter, or the like as long as it has a function of removing a high frequency component.

In addition, a prescaler (a fixed frequency divider) with a high operating frequency is included in the frequency divider 114, the high frequency Fo can be obtained. In the case where a programmable frequency divider is provided in the frequency divider 114, the arbitrary frequency Fo can be obtained In addition, in this embodiment mode, the frequency Fs of the reference signal INPUT may be inputted using a quartz-crystal oscillator. Alternatively, the frequency Fs of the reference signal INPUT may be inputted using an LC oscillator circuit. By providing the LC oscillator circuit, the PLL circuit 115 can be downsized. In this manner, a semiconductor device provided with the PLL circuit 115 can be downsized.

In addition, the PLL circuit 115 of this embodiment mode may additionally include another component, and for example, a swallow counter may be included. For example, in the case where the swallow counter is provided, the arbitrary frequency Fo can be obtained.

This embodiment mode can be implemented freely combining with any of Embodiment Modes 1 to 7.

Embodiment Mode 9

The present invention can provide a semiconductor device provided with a phase-locked loop circuit (PLL circuit). For example, as a semiconductor device, the invention can be applied to a semiconductor device of performing wireless transmission/reception of data. As such a semiconductor device, there are a wireless chip (also called a wireless tag, an IC tag, an IC chip, an RF (Radio Frequency) tag, an RFID tag, an electronic tag, or a transponder), a mobile phone, a cordless phone, a wireless LAN, and the like.

A structure of a wireless chip 1000 of the invention is described with reference to FIG. 10. The wireless chip 1000 includes an antenna 1001, a band-pass filter 1002, a power supply circuit 1003, a demodulation circuit 1004, a modulation circuit 1005, a PLL circuit 1006, a circuit for recognizing and determining a code 1007, a memory 1008, an encoding circuit 1009, and the like. As the PLL circuit 1006, the circuit having the structure described in Embodiment Mode 8 can be used.

Transmission and reception of a wireless signal are performed by the antenna 1001. Noise of the wireless signal received by the antenna 1001 is removed by the band-pass filter 1002, then the wireless signal is inputted to the power supply circuit 1003 and the demodulation circuit 1004. The power supply circuit 1003 generates a DC power supply voltage of a circuit within the wireless chip 1000, by using the inputted signal. The demodulation circuit 1004 demodulates the inputted wireless signal. A demodulated signal is input to the PLL circuit 1006 and the circuit for recognizing and determining a code 1007. The PLL circuit 1006 generates a clock with a predetermined frequency from the inputted signal. Based on the clock outputted from the PLL circuit 1006, the circuit for recognizing and determining a code 1007 analyzes a code of the demodulated signal to obtain corresponding data In response to the analyzed data, data communication is performed with the memory 1008. Data outputted from the memory 1008 is encoded in the encoding circuit 1009. An encoded signal is converted into a wireless signal in the modulation circuit 1005, and is transmitted from the antenna 1001.

According to the invention, downsizing and improvement of reliability of the PLL circuit 1006 can be realized. In this manner, downsizing and improvement of reliability of the wireless chip 1000 provided with the PLL circuit 1006 can be realized.

This embodiment mode can be implemented freely combining with any of Embodiment Modes 1 to 9.

Embodiment 1

This embodiment describes a specific structure of the semiconductor device of the invention with reference to FIGS. 11A to 11D and FIGS. 13A and 13B.

Figure 11A:
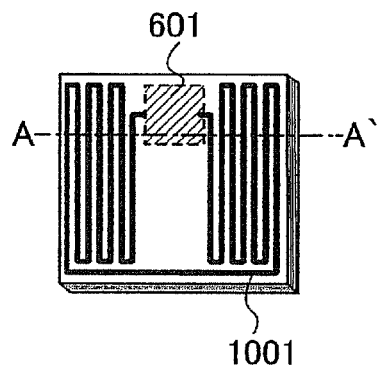
FIGS. 11A to 11D show Embodiment 1.
Figure 11B:
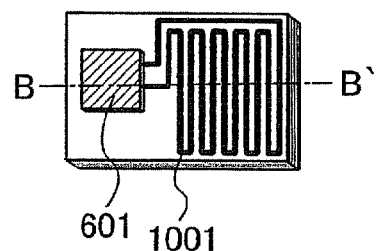
Figure 11C:
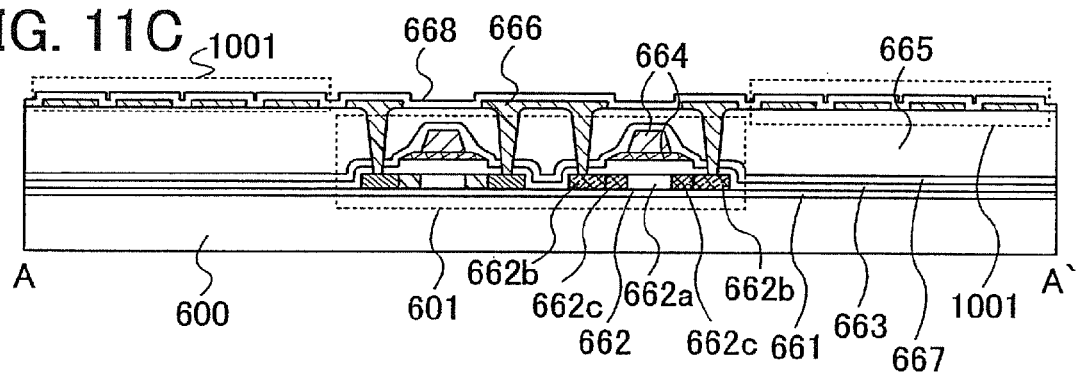
Figure 11D:
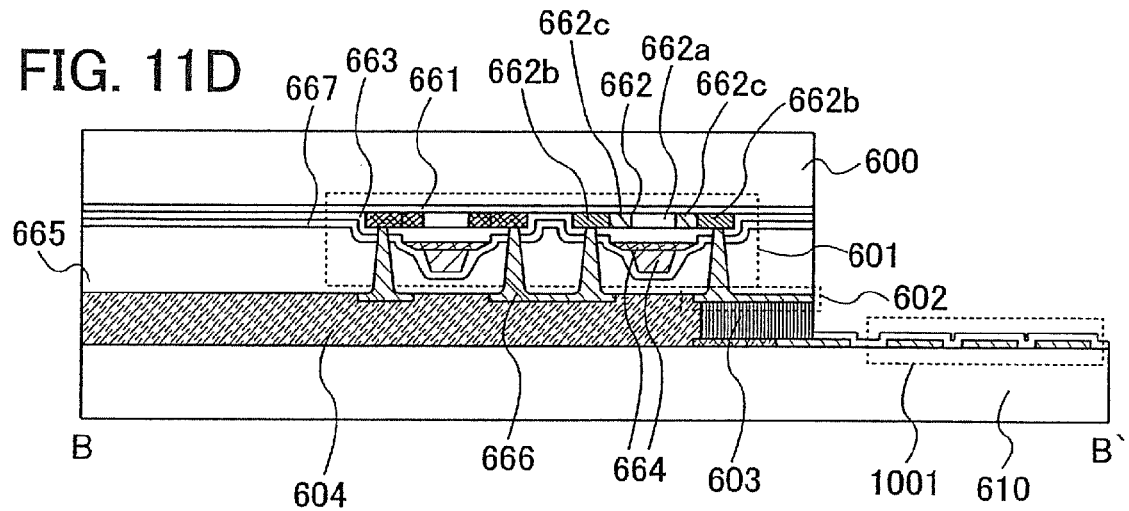

Structural examples of the antenna 1001 of the semiconductor device of the invention are shown in FIGS. 11A to 11D. There are two ways of providing the antenna 1001; one (hereinafter referred to as a first antenna installation way) is shown in FIGS. 11A and 11C and the other (hereinafter referred to as a second antenna installation way) is shown in FIGS. 11B and 11D. FIG. 11C is a cross sectional view along A-A' in FIG. 11A and FIG. 11D is a cross sectional view along B-B' in FIG. 11B.

In the first antenna installation way, the antenna 1001 is provided over a substrate 600 provided with a plurality of elements (hereinafter called an element group 601) (see FIGS. 11A and 11C). The element group 601 forms the circuits other than the antenna of the semiconductor device of the invention. The element group 601 includes a plurality of thin film transistors. In the shown structure, a conductive film which functions as the antenna 1001 is provided in the same layer as a wiring connected to a source or a drain of each thin film transistor in the element group 601. However, the conductive film which functions as the antenna 1001 may be provided in the same layer as a gate electrode 664 of each thin film transistor in the element group 601, or may be provided over an insulating film which is provided so as to cover the element group 601.

In the second antenna installation way, a terminal portion 602 is provided over the substrate 600 provided with the element group 601. The antenna 1001 provided over a substrate 610 other than the substrate 600 is connected to the terminal portion 602 (see FIGS. 11B and 11D). In the shown structure, a wiring connected to a source or a drain of each thin film transistor in the element group 601 is partially used as the terminal portion 602. Then, the substrate 600 and the substrate 610 provided with the antenna 1001 are attached to each other so as to be connected at the terminal portion 602. A conductive particle 603 and a resin 604 are provided between the substrate 600 and the substrate 610. The antenna 1001 and the terminal portion 602 are electrically connected by the conductive particle 603.

A structure and a manufacturing method of the element group 601 are described below. Formed over a large substrate in plural numbers and divided to be completed by cutting the large substrate, the element group 601 can be inexpensively provided. As the substrate 600, for example, a glass substrate such as barium borosilicate glass and alumino borosilicate glass, a quartz substrate, or a ceramic substrate can be used. Moreover, a semiconductor substrate on which an insulating film is formed may be used as well. A substrate formed of a synthetic resin having flexibility, such as plastic, may also be used. The surface of the substrate may be planarized by polishing by a CMP method or the like. Moreover, a thin substrate formed by polishing a glass substrate, a quartz substrate, or a semiconductor substrate may be used as well.

As a base layer 661 provided over the substrate 600, an insulating film formed of silicon oxide, silicon nitride, or silicon nitride oxide can be used. The base layer 661 can prevent an alkali metal such as Na or an alkaline earth metal contained in the substrate 600 from dispersing into a semiconductor layer 662 and adversely affecting the properties of each thin film transistor. Although the base layer 661 is formed of a single layer in FIGS. 11A to 11D, it may be formed of two or more layers as well. It is to be noted that the base layer 661 is not necessarily provided when dispersion of impurities is not a big problem, such as the case of using a quartz substrate.

Note that high density plasma may be directly applied to the surface of the substrate 600. High density plasma is generated by using a microwave, for example, a frequency of 2.45 GHz. As the high density plasma, high density plasma with an electron density of $10^{11}$ to $10^{13}/cm^3$, an electron temperature of 2 eV or less, and an ion energy pf 5 eV or less is used. Such high density plasma which features low electron temperature has low kinetic energy of active species, therefore, a film with less plasma damage and defects can be formed as compared to conventional plasma treatment. Plasma can be generated by using a plasma processing apparatus utilizing microwave excitation, which employs a radial slot antenna. The antenna which generates a microwave and the substrate 600 are placed at a distance of 20 to 80 mm (preferably 20 to 60 mm).

By performing the high density plasma treatment in a nitrided atmosphere such as an atmosphere containing nitrogen (N) and rare gas (containing at least one of He, Ne, Ar, Kr, and Xe), an atmosphere containing nitrogen, hydrogen (H), and rare gas, or an atmosphere containing ammonium ($NH_3$) and rare gas, the surface of the substrate 600 can be nitrided. In the case where glass, quartz, a silicon wafer, or the like is used for the substrate 600, a nitride layer formed on the surface of the substrate 600 which contains silicon nitride as a main component can be used as a blocking layer against impurities which are dispersed from the substrate 600 side. A silicon oxide film or a silicon oxynitride film may be formed over this nitride layer by a plasma CVD method to form the base layer 661.

Further, by applying similar high density plasma treatment to the surface of the base layer 661 formed of silicon oxide, silicon oxynitride, or the like, the surface and a depth of 1 to 10 nm from the surface can be nitrided. This extremely thin silicon nitride layer is favorable since it functions as a blocking layer and has less stress on the semiconductor layer 662 formed thereover.

As the semiconductor layer 662, a crystalline semiconductor film or an amorphous semiconductor film processed into an island shape can be used. Moreover, an organic semiconductor film may also be used. A crystalline semiconductor film can be obtained by crystallizing an amorphous semiconductor film. As the crystallization method, a laser crystallization method, a thermal crystallization method using RTA or an annealing furnace, a thermal crystallization method using a metal element which promotes crystallization, or the like can be employed. The semiconductor layer 662 includes a channel formation region 662a and a pair of impurity regions 662b to which impurity elements which impart conductivity are added. Shown here is a structure where low concentration impurity regions 662c to which the impurity elements are added at lower concentration than to the impurity regions 662b are provided between the channel forming region 662a and the pair of impurity regions 662b; however, the invention is not limited to this. The low concentration impurity regions 662c are not necessarily provided.

Figure 13A:
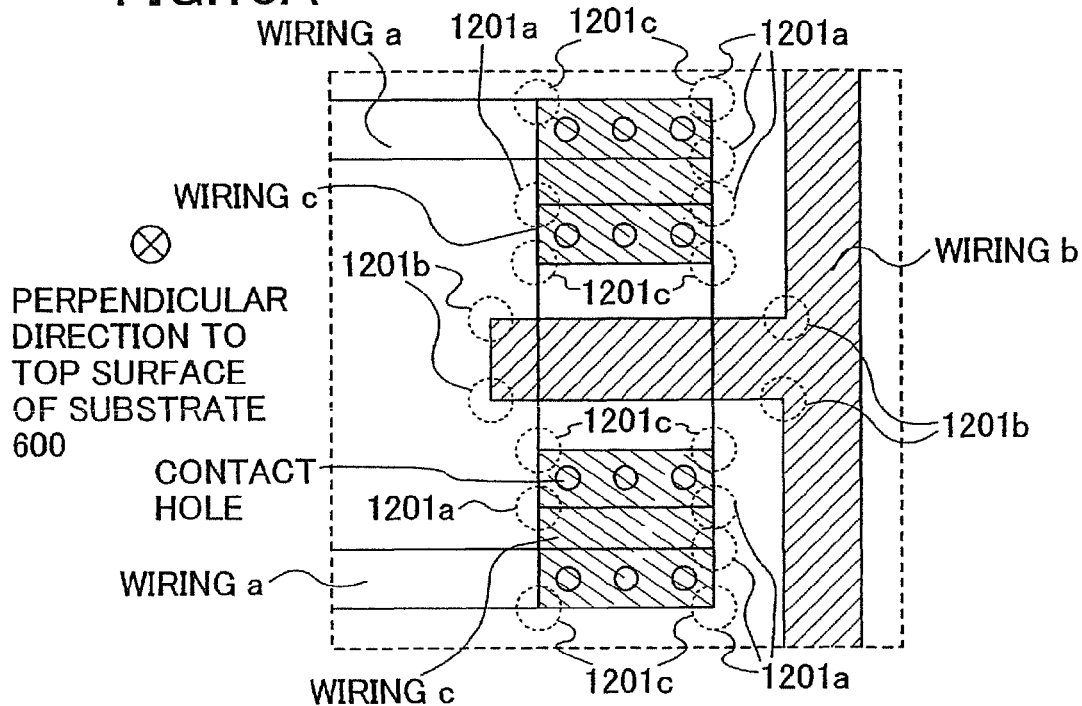
FIGS. 13A and 13B show Embodiment 1.
Figure 13B:
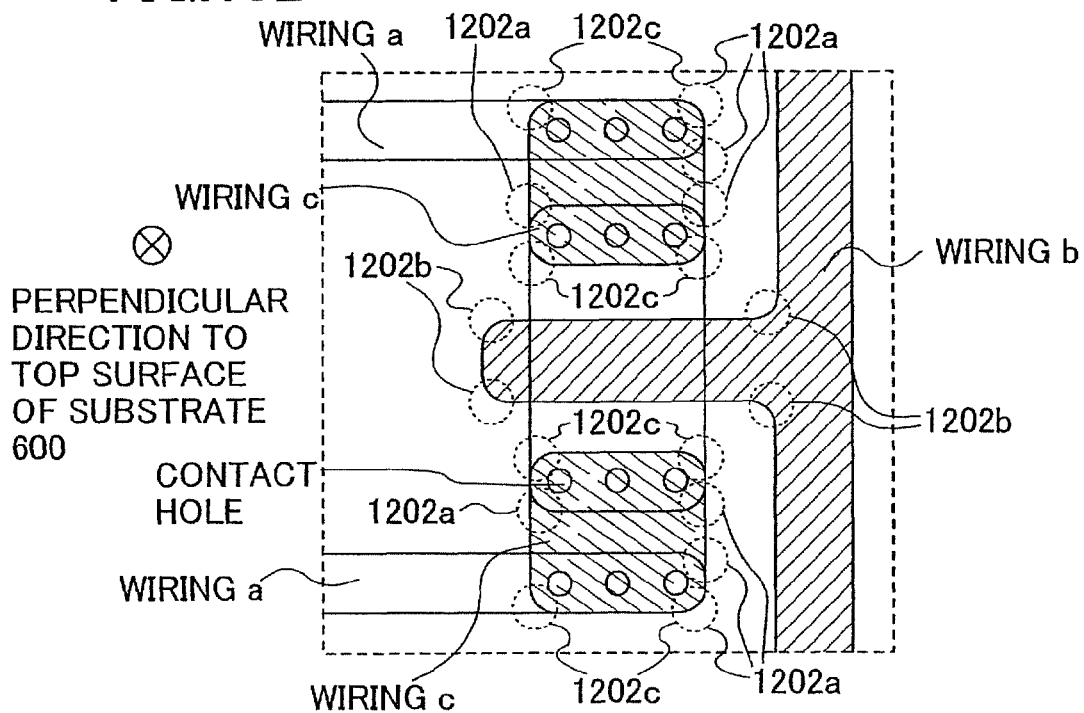

It is to be noted that the wiring which is formed simultaneously with the semiconductor layer 662 is preferably lead so that corner portions are rounded when seen perpendicularly to the top surface of the substrate 600. FIGS. 13A and 13B are schematic views showing the method to lead the wiring. In the figures, a wiring a denotes the wiring formed simultaneously with the semiconductor layer. FIG. 13A shows a conventional method to lead the wiring. FIG. 13B shows a method of the invention to lead the wiring. A corner portion 1202a is rounded as compared to a conventional corner portion 1201a. By rounding the corner portion, dust or the like can be prevented from remaining at the corner portion of the wiring. In this manner, defects of a semiconductor device due to dust can be reduced and the yield can be improved.

Impurity elements which impart conductivity type may be added to the channel formation region 662a of each thin film transistor. In this manner, a threshold voltage of each thin film transistor can be controlled.

A single layer or a stack of a plurality of layers of silicon oxide, silicon nitride, silicon nitride oxide or the like can be used as a first insulating layer 663. In this case, high density plasma may be applied to the surface of the first insulating layer 663 in an oxidized atmosphere or a nitrided atmosphere, thereby the first insulating layer 663 may be oxidized or nitrided to be densified. High density plasma is generated by using a microwave, for example, a frequency of 2.45 GHz as described above. It is to be noted that as the high density plasma, high density plasma with an electron density of $10^{11}$ to $10^{13}/cm^3$ and an electron temperature of 2 eV or less, and an ion energy of 5 eV or less is used. Plasma can be generated by using a plasma processing apparatus utilizing microwave excitation, which employs a radial slot antenna The antenna which generates a microwave and the substrate 600 are placed at a distance of 20 to 80 mm (preferably 20 to 60 mm) in the apparatus for generating high density plasma.

Note that, before forming the first insulating layer 663, the surface of the semiconductor layer 662 may be oxidized or nitrided by applying the high density plasma treatment to the surface. At this time, by performing the treatment in an oxidized atmosphere or a nitrided atmosphere with the substrate 600 at a temperature of 300 to 450° C., a favorable interface with the first insulating layer 663 which is formed thereover can be formed As the nitrided atmosphere, an atmosphere containing nitrogen (N) and rare gas (containing at least one of He, Ne, Ar, Kr, and Xe), an atmosphere containing nitrogen, hydrogen (H), and rare gas, or an atmosphere containing ammonium ($NH_3$) and rare gas can be used. As the oxidized atmosphere, an atmosphere containing oxygen (O) and rare gas, an atmosphere containing oxygen, hydrogen (H), and rare gas or an atmosphere containing dinitrogen monoxide ($N_2O$) and rare gas can be used.

For the gate electrode 664, a single layer structure or a stacked-layer structure formed of an element selected from Ta, W, Ti, Mo, Al, Cu, Cr, and Nd, or an alloy or a compound thereof may be employed. In the figures, the gate electrode 664 has a two-layer structure. It is to be noted that the gate electrode 664 and a wiring which is formed simultaneously with the gate electrode 664 are preferably led so that corner portions thereof are rounded when seen perpendicularly to the top surface of the substrate 600. The leading method can be the same as the method shown in FIG. 13B. The gate electrode 664 and the wiring which is formed simultaneously with the gate electrode 664 are denoted by a wiring b in the figures. By rounding a corner portion 1201b like a corner portion 1202b, dust or the like can be prevented from remaining at the corner portion of the wiring. In this manner, defects of a semiconductor device due to dust can be reduced and the yield can be improved.

A thin film transistor is structured by the semiconductor layer 662, the gate electrode 664, and the first insulating layer 663 which functions as a gate insulating film between the semiconductor layer 662 and the gate electrode 664. Although the thin film transistor has a top gate structure in this embodiment, it may also be a bottom gate transistor having a gate electrode under the semiconductor layer, or a dual gate transistor having gate electrodes over and under the semiconductor layer.

A second insulating layer 667 is preferably an insulating film having a barrier property to block ion impurities, such as a silicon nitride film. The second insulating layer 667 is formed of silicon nitride or silicon oxynitride. The second insulating layer 667 functions as a protective film which prevents contamination of the semiconductor layer 662. After stacking the second insulating layer 667, the second insulating layer 667 may be hydrogenated by introducing hydrogen gas and applying the aforementioned high density plasma treatment. Alternatively, the second insulating layer 667 may be nitrided and hydrogenated by introducing ammonium ($NH_3$) gas. Further alternatively, oxidization-nitridation treatment and hydrogenation treatment may be performed by introducing oxygen, dinitrogen monoxide ($N_2O$) gas, or the like and hydrogen gas. By performing nitridation treatment, oxidization treatment, or oxidization-nitridation treatment by this method, the surface of the second insulating layer 667 can be densified. In this manner, a function of the second insulating layer 667 as a protective film can be enhanced. The hydrogen introduced in the second insulating layer 667 is discharged when thermal treatment at 400 to 450° C. is applied, thereby the semiconductor layer 662 can be hydrogenated. Note that this hydrogenation treatment may be performed in combination with the hydrogenation treatment using the first insulating layer 663.

For a third insulating layer 665, a single layer structure or a stacked-layer structure of an inorganic insulating film or an organic insulating film can be employed. As the inorganic insulating film, a silicon oxide film formed by a CVD method, a silicon oxide film formed by a SOG (Spin On Glass) method, or the like can be used. As the organic insulating film, a film formed of polyimide, polyamide, BCB (benzocyclobutene), acrylic, a positive photosensitive organic resin, a negative photosensitive organic resin, or the like can be used.

Further, the third insulating layer 665 can also be formed of a material having a skeleton structure formed of a bond of silicon (Si) and oxygen (O). An organic group containing at least hydrogen (e.g., an alkyl group or aromatic hydrocarbon) is used as a substituent of this material. Alternatively, a fluoro group may be used as the substituent. Further alternatively, a fluoro group and an organic group containing at least hydrogen may be used as the substituents.

For a wiring 666, a single layer structure or a stacked-layer structure formed of an element selected from Al, Ni, W, Mo, Ti, Pt, Cu, Ta, Au, and Mn, or an alloy containing a plurality of the elements can be used. In the figures, a single layer structure is used as an example. It is to be noted that the wiring 666 is preferably led so that corner portions thereof are rounded when seen perpendicularly to the top surface of the substrate 600. The leading method can be the same as the method shown in FIG. 13B. The wiring 666 is denoted by a wiring c in the figures. By rounding a corner portion 1201c like a corner portion 1202c, dust or the like can be prevented from remaining at the corner portion of the wiring. In this manner, defects of a semiconductor device due to dust can be reduced and the yield can be improved. In the structure shown in FIGS. 11A and 11C, the wiring 666 functions as the antenna 1001 as well as the wiring connected to a source or a drain of each thin film transistor. In the structure shown in FIGS. 11B and 11D, the wiring 666 functions as the terminal portion 602 as well as the wiring connected to a source or a drain of each thin film transistor.

It is to be noted that the antenna 1001 can also be formed by a droplet discharge method using a conductive paste containing nano-particles such as Au, Ag, and Cu. The droplet discharge method is a collective term for a method to form a pattern by discharging droplets, such as an ink jet method or a dispenser method, which has advantage in that utilization efficiency of a material is improved, and the like.

In the structure shown in FIGS. 11A and 11C, a fourth insulating layer 668 is formed over the wiring 666. For the fourth insulating layer 668, a single layer structure or a stacked-layer structure of an inorganic insulating film or an organic insulating film can be used. The fourth insulating layer 668 functions as a protective layer of the antenna 1001.

Figure 12A:
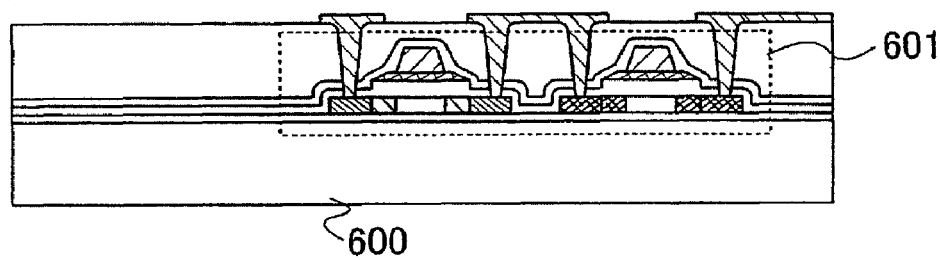
FIGS. 12A to 12D show Embodiment 1.
Figure 12B:
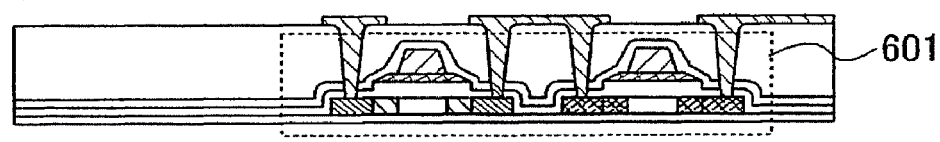
Figure 12C:
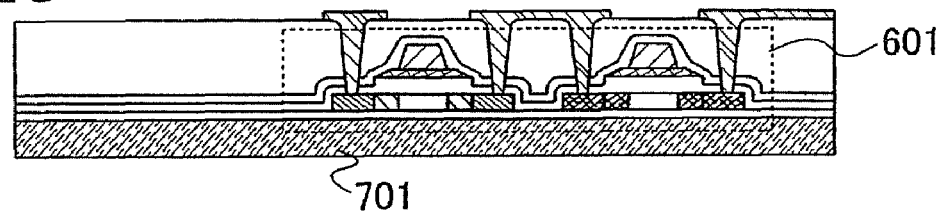

Further, as for the element group 601, the element group 601 formed over the substrate 600 (see FIG. 12A) may be used as it is, or alternatively, the element group 601 may be peeled off the substrate 600 (see FIG. 12B) and attached to a flexible substrate 701 (see FIG. 12C). The flexible substrate 701 has flexibility, as which a plastic substrate formed of polycarbonate, polyarylate, polyether sulfone, or the like, a ceramic substrate, or the like can be used.

The element group 601 may be peeled off the substrate 600 by (A) providing a peeling layer between the substrate 600 and the element group 601 in advance and removing the peeling layer by using an etchant, (B) partially removing the peeling layer by using an etchant and then physically peeling the element group 601 from the substrate 600, or (C) mechanically removing the substrate 600 having high heat resistance over which the element group 601 is formed or removing it by etching using solution or gas. It is to be noted that being physically peeled off refers to being peeled off by external stress, e.g., being peeled off by stress applied by wind pressure blown from a nozzle, ultrasonic wave, or the like.

As a more specific method of the aforementioned methods (A) and (B), a method in which a metal oxide film is provided between the substrate 600 having high heat resistance and the element group 601 and the metal oxide film is weakened by crystallization to peel off the element group 601, or a method in which an amorphous silicon film containing hydrogen is provided between the substrate 600 having high heat resistance and the element group 601 and removing the amorphous silicon film by laser light irradiation or etching to peel off the element group 601 can be used.

When the element group 601 which has been peeled off is attached to the flexible substrate 701, a commercial adhesive can be used, e.g., an epoxy resin-based adhesive or a resin additive.

Figure 12D:
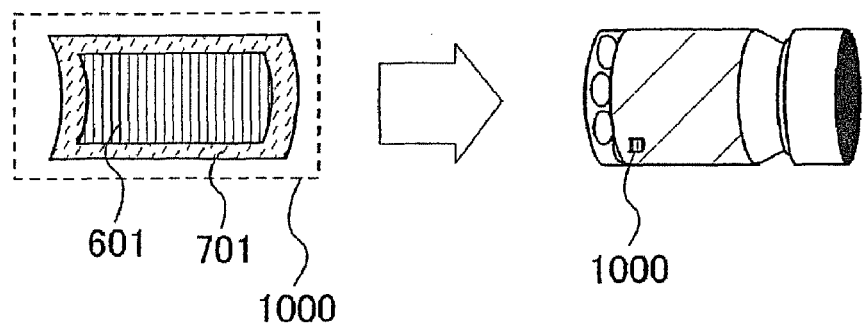

By attaching the element group 601 to the flexible substrate 701 over which an antenna is formed so that the element group 601 and the antenna are electrically connected, a semiconductor device which is thin, lightweight, and can withstand shock when dropped is completed (see FIG. 12C). By using the flexible substrate 701 which is inexpensive, an inexpensive semiconductor device can be provided Moreover, as the flexible substrate 701 has flexibility, it can be attached to a curved surface or an irregular-shaped surface, thereby realizing a variety of applications. For example, the wireless chip 1000 which is one mode of the semiconductor device of the invention can be tightly attached to a curved surface such as a medicine bottle (see FIG. 12D). Moreover, by reusing the substrate 600, a semiconductor device can be manufactured at low cost.

The element group 601 can be covered with a film to be sealed. The surface of the film may be coated with silicon dioxide (silica) powder, this coating allows the element group 601 to be kept waterproof in an environment of high temperature and high humidity, that is, the element group 601 can have moisture resistance. Moreover, the surface of the film may also have antistatic properties. The surface of the film may also be coated with a material containing carbon as a main component (e.g., diamond like carbon); the coating increases the intensity and can prevent the degradation or destruction of a semiconductor device. Further, the film may also be formed of a base material (e.g., resin) mixed with silicon dioxide, a conductive material, or a material containing carbon as a main component. In addition, a surface active agent may be provided on the surface of the film, or directly added into the film, so that the element group 601 can have antistatic properties.

This embodiment can be freely combined with any of the aforementioned embodiment modes.

Embodiment 2

Figure 14A:
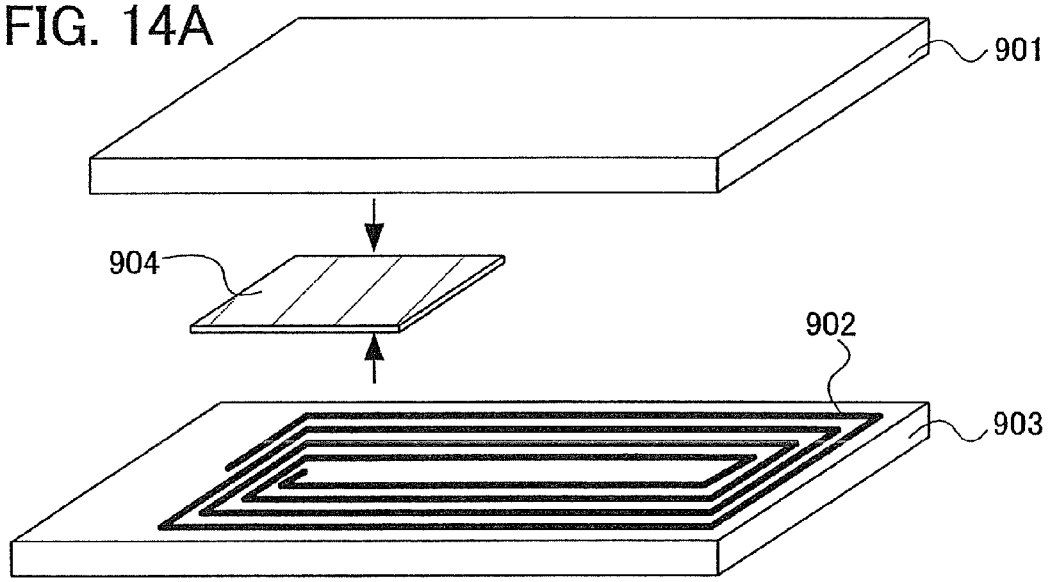
FIGS. 14A to 14C show Embodiment 2.
Figure 14B:
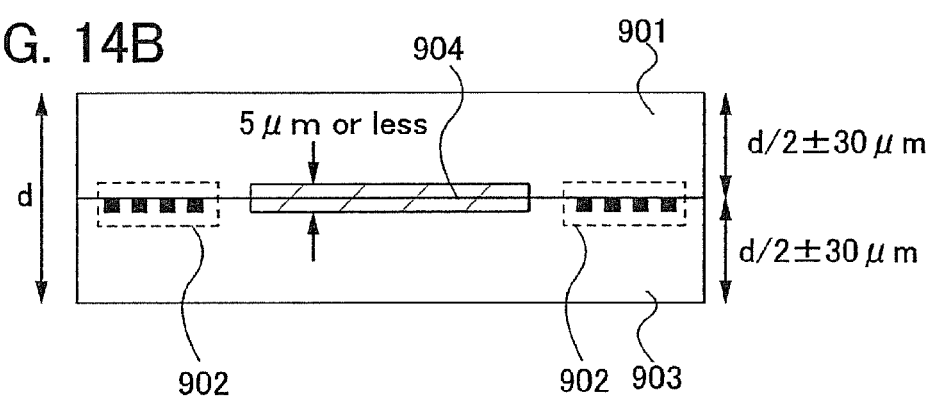
Figure 14C:
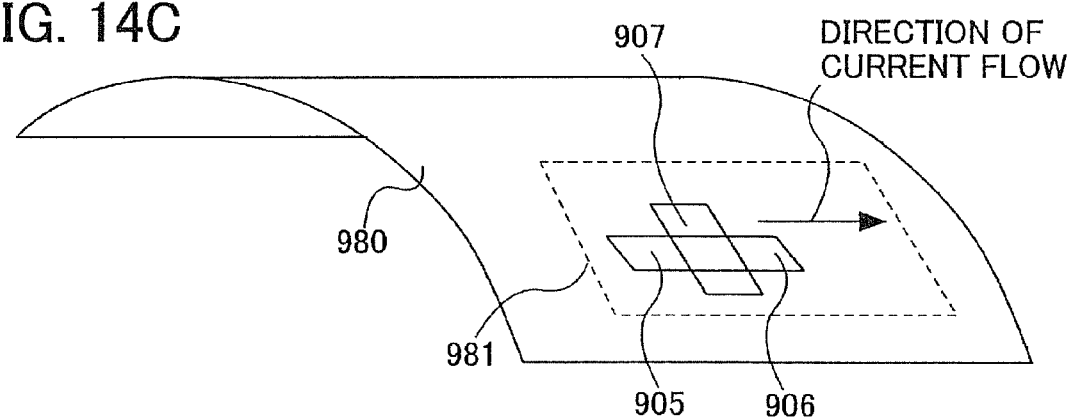

This embodiment describes an example in which the semiconductor device of the invention has a flexible structure, with reference to FIGS. 14A to 14C. In FIG. 14A, the semiconductor device of the invention includes a flexible protective layer 901, a flexible protective layer 903 including an antenna 902 (which corresponds to the antenna 1001), and an element group 904 formed by a peeling process or thinning a substrate. The element group 904 can have the same structure to the element group 601 described in Embodiment 1. The antenna 902 formed over the protective layer 903 is electrically connected to the element group 904. Although the antenna 902 is formed only over the protective layer 903 in FIGS. 14A to 14C, the invention is not limited to this structure and the antenna 902 may also be formed over the protective layer 901 as well. It is preferable that a barrier film formed of a silicon nitride film or the like be provided between the element group 904 and the protective layer 901, and between the element group 904 and the protective layer 903; accordingly, a semiconductor device with improved reliability can be provided without contaminating the element group 904.

The antenna 902 can be formed of Ag, Cu, or a metal plated with Ag or Cu. The element group 904 and the antenna 902 can be connected to each other with an anisotropic conductive film by applying ultraviolet treatment or ultrasonic wave treatment. Note that the element group 904 and the antenna 902 may be attached to each other by using a conductive paste or the like.

The element group 904 is sandwiched between the protective layer 901 and the protective layer 903, thereby completing a semiconductor device (see an arrow in FIG. 14A).

FIG. 14B shows a cross sectional structure of the semiconductor device formed in this manner. The element group 904 which is sandwiched has a thickness of 5 μm or less, and preferably 0.1 to 3 μm. Moreover, where the total thickness of the protective layer 901 and the protective layer 903 which are stacked is d, each of the protective layer 901 and the protective layer 903 preferably has a thickness of (d/2)±30 μm, and more preferably (d/2)±10 μm. Further, it is preferable that each of the protective layer 901 and the protective layer 903 have a thickness of 10 to 200 μm. In addition, the element group 904 has an area of 10 mm square (100 mm$^2$) or less and more preferably 0.3 to 4 mm square (0.09 to 16 mm$^2$).

The protective layer 901 and the protective layer 903 which are formed of an organic resin material have high resistance against bending. The element group 904 itself which is formed by a peeling process or thinning a substrate also has higher resistance against bending as compared to a single crystal semiconductor. Further, as the element group 904, and the protective layer 901 and the protective layer 903 can be tightly attached to each other without any space, a completed semiconductor device itself has also high resistance against bending. Such element group 904 surrounded by the protective layer 901 and the protective layer 903 may be provided on a surface of or inside another object or may be embedded in paper.

Description is made with reference to FIG. 14C of the case of attaching a semiconductor device including the element group 904 to a substrate having a curved surface. In the figure, one transistor 981 selected from the element group 904 is shown. In the transistor 981, a current flows from one 905 of a source or a drain to the other 906 of the source or the drain in accordance with a potential of a gate electrode 907. The transistor 981 is provided so that the direction (a carrier moving direction) of current flow in the transistor 981 and the direction of the arc of a substrate 980 cross at right angles. According to such an arrangement, the transistor 981 is less affected by stress even when the substrate 980 is bent and draws an arc, and thus variations in properties of the transistor 981 included in the element group 904 can be suppressed.

This embodiment can be freely combined with any of the aforementioned embodiment modes and Embodiment 1.

Embodiment 3

This embodiment describes a structural example of a transistor included in a circuit for structuring the semiconductor device of the invention. The transistor can be formed of a MOS transistor formed over a single crystalline substrate, as well as a thin film transistor (TFT). FIG. 17 is a view showing a cross-sectional structure of a transistor for forming such a circuit. In FIG. 17, n-channel transistors 2001 and 2002, a capacitor 2004, a resistor 2005, and a p-channel transistor 2003 are shown. Each transistor has a semiconductor layer 4405, an insulating layer 4408, and a gate electrode 4409. The gate electrode 4409 has a stacked-layer structure of a first conductive layer 4403 and a second conductive layer 4402. In addition, FIGS. 18A to 18D are top views corresponding to the transistor, capacitor, and resistor shown in FIG. 17, which can also be referred to.

In FIG. 17, the n-channel transistor 2001 has lightly doped drain (LDD) regions respectively on both sides of a region in the semiconductor layer 4405, overlapped with the gate electrode. The lightly doped drain (LDD) region is a impurity region 4407 which is doped with impurities which imparts n-type conductivity at lower concentration than the impurity concentration of a source/drain region (an impurity region 4406) which is in contact with a wiring 4404. Into the impurity region 4406 and the impurity region 4407, phosphorus or the like is added as the impurities which imparts n-type conductivity in the case of forming the n-channel transistor 2001. The LDD region is formed to suppress hot electron degradation and short-channel effects.

Figure 18A:
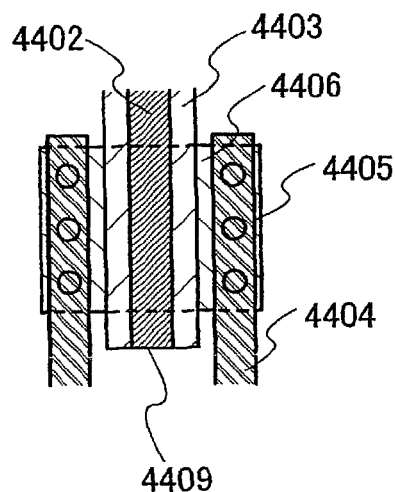
FIGS. 18A to 18E show Embodiment 3.

As shown in FIG. 18A, in the gate electrode 4409 of the n-channel transistor 2001, the first conductive layer 4403 is provided on both sides of the second conductive layer 4402. In this case, the thickness of the first conductive layer 4403 is smaller than that of the second conductive layer 4402. The first conductive layer 4403 is formed to have such a thickness that ion species accelerated with an electric field of 10 to 100 kV can pass through. The impurity regions 4407 are formed to overlap the first conductive layer 4403 of the gate electrode 4409. In other words, the LDD regions overlapping the gate electrode 4409 are formed. In this structure, the impurity regions 4407 are formed in a self-aligned manner by adding impurities of one conductivity type into the gate electrode 4409 through the first conductive layer 4403 with the second conductive layer 4402 as a mask. That is, the LDD regions overlapping the gate electrode are formed in a self-aligned manner.

Figure 10:
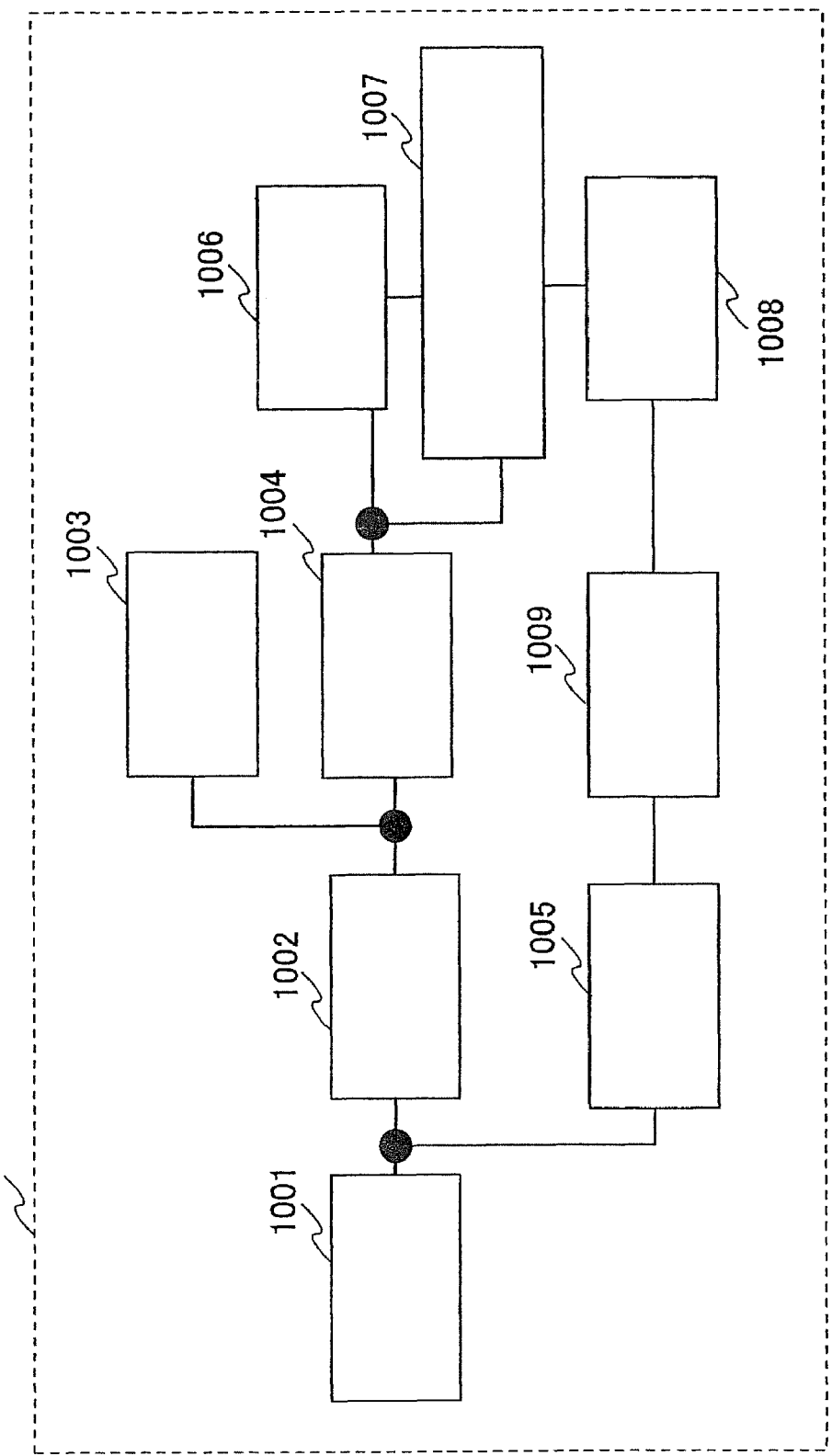
FIG. 10 shows a structure of Embodiment Mode 9.

A transistor having LDD regions on both sides of a region in a semiconductor layer, which overlapped with a gate electrode is applied to a transistor for structuring a transmission gate (also called an analog switch) or a transistor used in a rectification circuit in the power supply circuit 1003 shown in FIG. 10. Such a transistor to which positive and negative voltages are both applied to source and drain electrodes thereof preferably includes LDD regions on both sides of a region in a semiconductor layer, overlapped with a gate electrode.

Figure 18B:
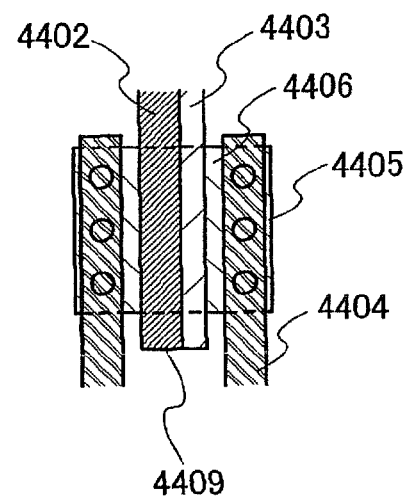

In FIG. 17, the n-channel transistor 2002 includes the impurity region 4407 doped with impurity elements which imparts conductivity type at lower concentration than the impurity concentration of the impurity region 4006, on one side of a region in the semiconductor layer 4405, overlapped with the gate electrode. As shown in FIG. 18B, the first conductive layer 4403 is formed on one side of the second conductive layer 4402 in the gate electrode 4409 of the n-channel transistor 2002. In this case also, the LDD region can be formed in a self-aligned manner by adding impurities of one conductivity type through the first conductive layer 4403 with the second conductive layer 4402 as a mask.

A transistor having an LDD region on one side of a region in a semiconductor layer, overlapped with a gate electrode thereof may be applied to a transistor to which only one of a positive voltage or a negative voltage is applied between source and drain electrodes thereof. Specifically, the transistor may be applied to a transistor for structuring a logic gate such as an inverter circuit, a NAND circuit, a NOR circuit, or a latch circuit, or a transistor for structuring an analog circuit such as a sense amplifier, a constant voltage generating circuit, or a VCO circuit.

Figure 18C:
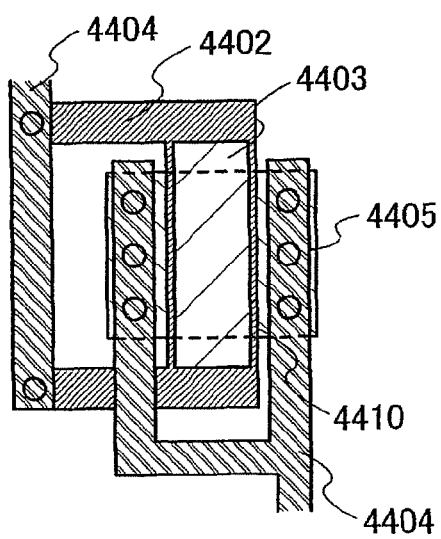

In FIG. 17, the capacitor 2004 is formed by sandwiching the insulating layer 4408 between the first conductive layer 4403 and the semiconductor layer 4405. The semiconductor layer 4405 for forming the capacitor 2004 has impurity regions 4410 and 4411. The impurity region 4411 is formed in a position overlapped with the first conductive layer 4403, in the semiconductor layer 4405. In addition, the impurity region 4410 is in contact with the wiring 4404. The impurity region 4411 can be doped with impurities of one conductivity type through the first conductive layer 4403; therefore, the impurity concentration contained can be the same or different between the impurity regions 4410 and 4411. In either case, the semiconductor layer 4405 which functions as an electrode in the capacitor 2004 is preferably doped with impurities of one conductivity type to reduce the resistance. In addition, the first conductive layer 4403 can be served enough as an electrode by using the second conductive layer 4402 as an auxiliary electrode as shown in FIG. 18C. By providing such a multiple electrode structure in which the first conductive layer 4403 and the second conductive layer 4402 are combined with each other, the capacitor 2004 can be formed in a self-aligned manner.

The capacitor 2004 can be used as a storage capacitor of the power supply circuit 1003, a resonant capacitor which is provided in parallel with the antenna 1001, or a capacitor included in the demodulation circuit 1004 shown in FIG. 10. In particular, the resonant capacitor to which both positive and negative voltages are applied between two terminals thereof is required to function as a capacitor regardless of whether the voltage between the two terminals is positive or negative.

Figure 18D:
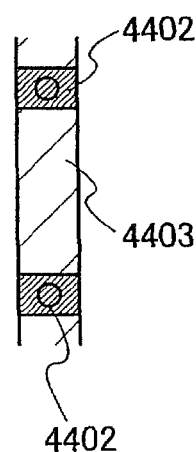

In FIG. 17, the resistor 2005 is formed of the first conductive layer 4403 (see also FIG. 18D). The first conductive layer 4403 is formed to have a thickness of approximately 30 to 150 nm, thus the width and length thereof can be appropriately set to form the resistor.

The resistor can be used as a resistance load included in the modulation circuit 1005 shown in FIG. 10, and can also be used as a resistor included in the demodulation circuit 1004 shown in FIG. 10. Further, it may also be used as a load in the case of controlling current by a VCO circuit or the like. The resistor may be structured by a semiconductor layer containing impurity elements at high concentration or a thin metal layer. While the resistance value of the semiconductor layer depends on the film thickness, the film quality, the impurity concentration, the activation rate, or the like, the metal layer is preferable since the resistance value is determined by the film thickness and the film quality and thus less variable.

Figure 18E:
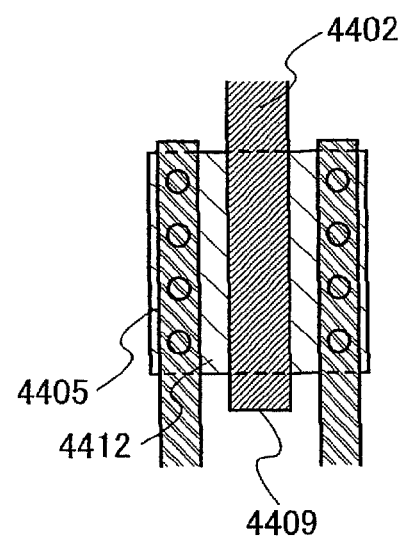

In FIG. 17, the p-channel transistor 2003 has impurity regions 4412 in the semiconductor layer 4405. The impurity regions 4412 function source and drain regions respectively in contact with the wiring 4404. The gate electrode 4409 has a structure in which the first conductive layer 4403 and the second conductive layer 4402 are overlapped with each other (see also FIG. 18E). The p-channel transistor 2003 is a transistor with a single drain structure without an LDD. In the case of forming the p-channel transistor 2003, the impurity regions 4412 are doped with boron or the like as impurities which impart p-type conductivity; alternatively, if the impurity regions 4412 are doped with phosphorus, an n-channel transistor with a single drain structure can be formed as well.

To one or both of the semiconductor layer 4405 and the gate insulating layer 4408, an oxidation or nitridation treatment may be performed by high density plasma treatment. This treatment can be performed similarly to the method described in Embodiment 1.

By carrying out this treatment, a defect level of an interface between the semiconductor layer 4405 and the gate insulating layer 4408 can be reduced. The gate insulating layer 4408 can be dense by performing the treatment to the gate insulating layer 4408. That is, it is possible to suppress generation of charge defect and to suppress fluctuation of a threshold voltage of the transistor. In addition, when the transistor is driven at a voltage of 3 V or less, an insulating layer that is oxidized or nitrided by the plasma treatment can be applied as the gate insulating layer 4408. Moreover, when a drive voltage of the transistor is 3V or more, the gate insulating layer 4408 can be formed by combining an insulating layer formed on a surface of the semiconductor layer 4405 by the plasma treatment and an insulating layer deposited by a CVD method (e.g., a plasma CVD method or a thermal CVD method). Further, this insulating layer can also be used as a dielectric layer of the capacitor 2004; in this case, since the insulating layer that is formed by the plasma treatment can have a thickness of 1 to 10 nm and is a dense film, a capacitor having a high charge capacity can be formed.

Elements with various structures can be formed by combining conductive layers which are different in thickness as described with reference to FIG. 17 and FIGS. 18A to 18E. A region where only the first conductive layer is formed and a region where the first and second conductive layers are stacked can be formed using a photomask or a reticle provided with a diffraction grating pattern or an assist pattern having a function of reducing light intensity formed of a semi-transparent film. That is, in exposing a photoresist to light in a photolithography step, by adjusting the amount of transmitting light of the photomask, the thickness of a resist mask to be developed is made different. In this case, the photomask or reticle provided with slits of the resolution limit or less may be used to form a resist having a complicated shape as described above. In addition, baking at about 200° C. may be performed after development to deform a mask pattern formed of a photoresist material.

In addition, by using the photomask or reticle provided with a diffraction grating pattern or an assist pattern having a function of reducing light intensity formed of a semi-transparent film, the region where only the first conductive layer is formed and the region where the first and second conductive layers are stacked can be formed continuously. As shown in FIG. 18A, the region where only the first conductive layer is formed can be selectively formed over the semiconductor layer. Such a region where only the first conductive layer is formed is effective over the semiconductor layer, however, it is not necessary in the other region (a wiring region formed continuously with the gate electrode). By using this photomask or reticle, it is not necessary to form the region where only the first conductive layer is formed in a wiring portion; thus, density of a wiring can be substantially increased.

In the case of FIG. 17 and FIGS. 18A to 18E, the first conductive layer is formed of a refractory metal such as tungsten (W), chromium (Cr), tantalum (Ta), tantalum nitride (TaN), or molybdenum (Mo), or an alloy or a compound containing the refractory metal as its main component to have a thickness of 30 to 50 nm. In addition, the second conductive layer is formed of a refractory metal such as tungsten (W), chromium (Cr), tantalum (Ta), tantalum nitride (TaN), or molybdenum (Mo), or an alloy or a compound containing the refractory metal as its main component to have a thickness of 300 to 600 nm. For example, the first and second conductive layers are formed of different conductive materials respectively such that a difference of the etching rate occurs in an etching step performed later. As an example, a TaN film can be used as the first conductive layer and a tungsten film can be used as the second conductive layer.

This embodiment shows that transistors having different electrode structures, a capacitor, and a resistor can be formed separately with the same process by using the photomask or the reticle provided with a diffraction grating pattern or an assist pattern having a function of reducing light intensity formed of a semi-transparent film. Accordingly, in accordance with circuit characteristics, elements having different modes can be formed without increasing the number of steps and integrated.

This embodiment can be freely combined with any of the aforementioned embodiment modes and Embodiments 1 and 2.

Embodiment 4

This embodiment describes an example of a static RAM (SRAM) that can be used as a memory of the semiconductor device of the invention, with reference to FIGS. 19A and 19B, FIGS. 20A and 20B, and FIGS. 21A and 21B.

Figure 19A:
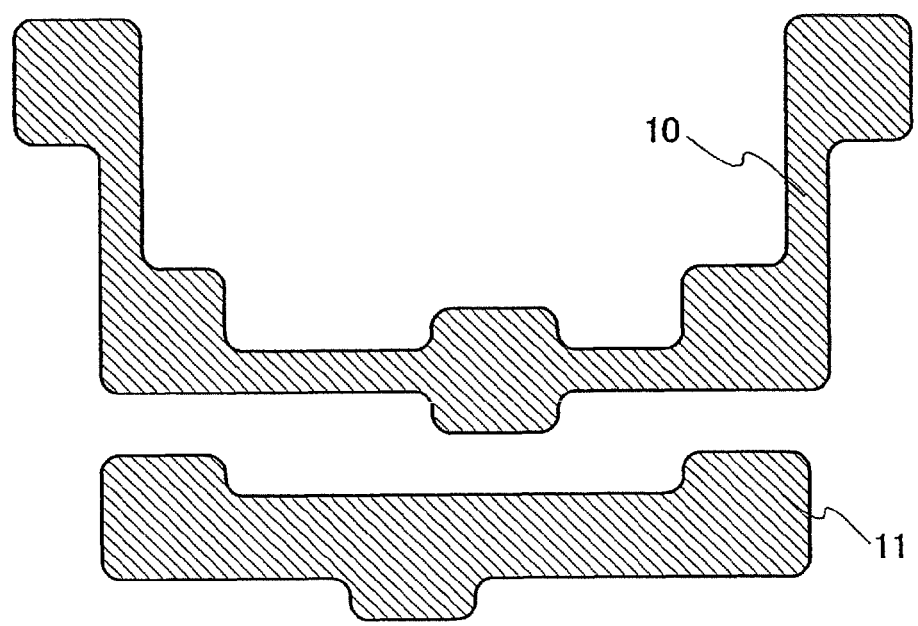
FIGS. 19A and 19B show Embodiment 4.

Semiconductor layers 10 and 11 shown in FIG. 19A are preferably formed of silicon or a crystalline semiconductor containing silicon as its component. For example, polycrystalline silicon that is obtained by crystallizing a silicon film by laser annealing or the like, single crystal silicon, or the like is applied. Besides, a metal-oxide semiconductor, amorphous silicon, or an organic semiconductor that shows semiconductor characteristics can also be applied.

At any event, a semiconductor layer to be formed first is formed over an entire surface of a substrate having an insulating surface or a part thereof (a region having an area larger than that determined as a semiconductor region of a transistor). Then, by photolithography technology, a mask pattern is formed over the semiconductor layer. By carrying out etching treatment to the semiconductor layer by using this mask pattern, the island-shaped semiconductor layers 10 and 11 each having a specific shape are formed which includes a source region, a drain region and a channel formation region of a TFT. The semiconductor layers 10 and 11 are determined in consideration with adequacy of the layout.

Figure 19B:
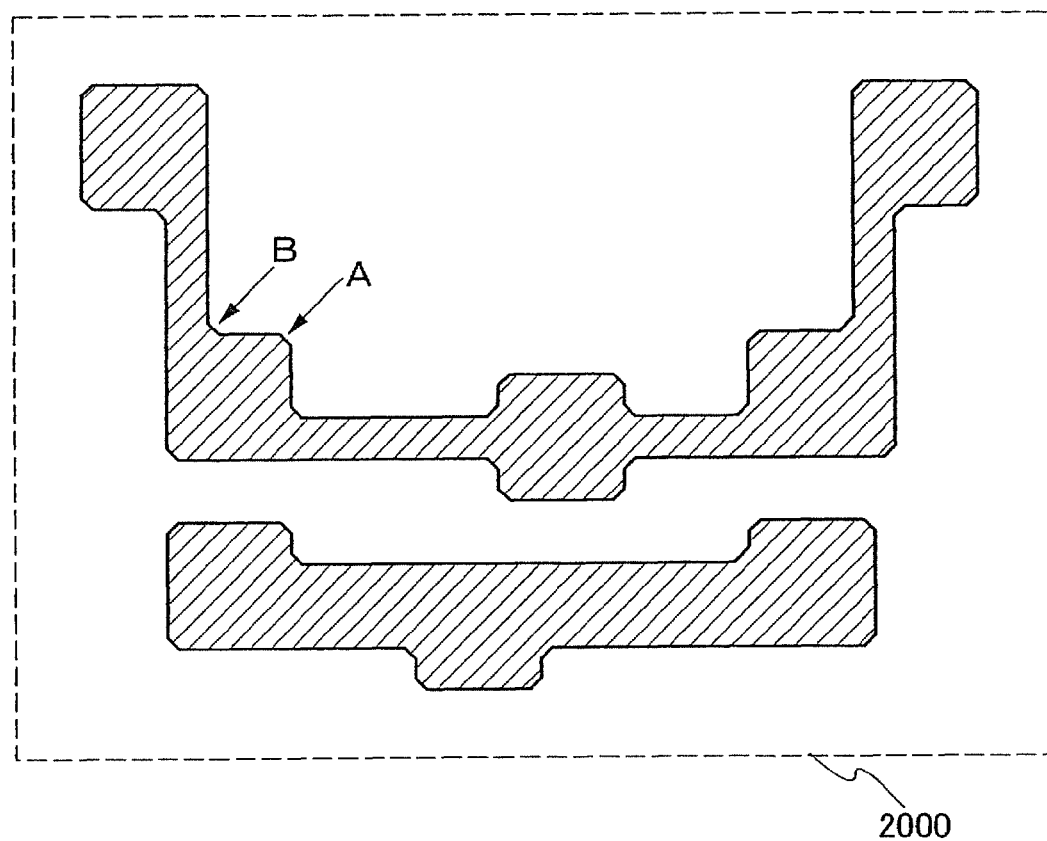

A photomask for forming the semiconductor layers 10 and 11 shown in FIG. 19A has a mask pattern 2000 shown in FIG. 19B. This mask pattern 2000 is different depending on whether a resist to be used in the photolithography process is a positive type or a negative type. In the case where a positive type resist is used, the mask pattern 2000 shown in FIG. 19B is formed as a light shielding portion. The mask pattern 2000 has a shape where a top portion A is removed. This photomask pattern is chamfered so as to cut off a rectangular triangle having one side of 10 μm or less at a corner portion, for example. In addition, a bending portion B is bent so as not to bend at right angle in a corner portion thereof. Enlarging the bent portion B, there is a shape bended at a plurality of levels.

The shape of the mask pattern 2000 shown in FIG. 19B is reflected in the semiconductor layers 10 and 11 shown in FIG. 19A. In that case, the homothetic shape of the mask pattern 2000 may be transferred, or may be transferred such that the corner portion of the mask pattern 2000 is more round. That is, a roundness in which the pattern shape is more rounded than in the photomask pattern 2000 may be provided.

Figure 20A:
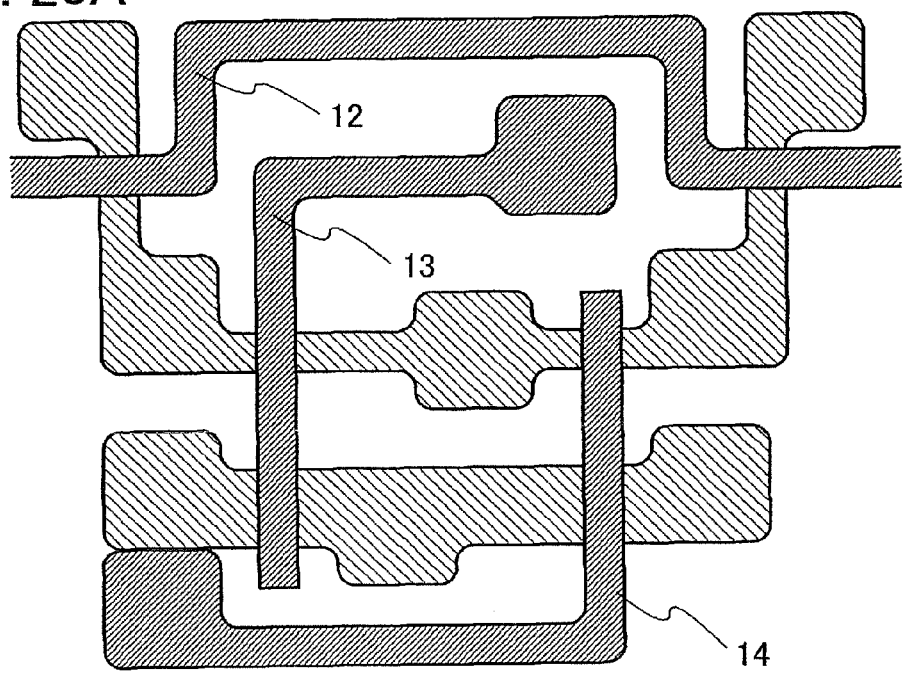
FIGS. 20A and 20B show Embodiment 4.

Over the semiconductor layers 10 and 11, an insulating layer containing at least partially silicon oxide or silicon nitride is formed. One purpose of forming this insulating layer is a gate insulating layer. Then, as shown in FIG. 20A, gate wirings 12, 13, and 14 are formed so as to partially overlap with the semiconductor layers. The gate wiring 12 is formed corresponding to the semiconductor layer 10. The gate wiring 13 is formed corresponding to the semiconductor layers 10 and 11. And the gate wiring 14 is formed corresponding to the semiconductor layers 10 and 11. As for the gate wiring, a metal layer or a highly-conductive semiconductor layer is formed to be a film, and the shape thereof is formed over the insulating layer by photolithography technology.

Figure 20B:
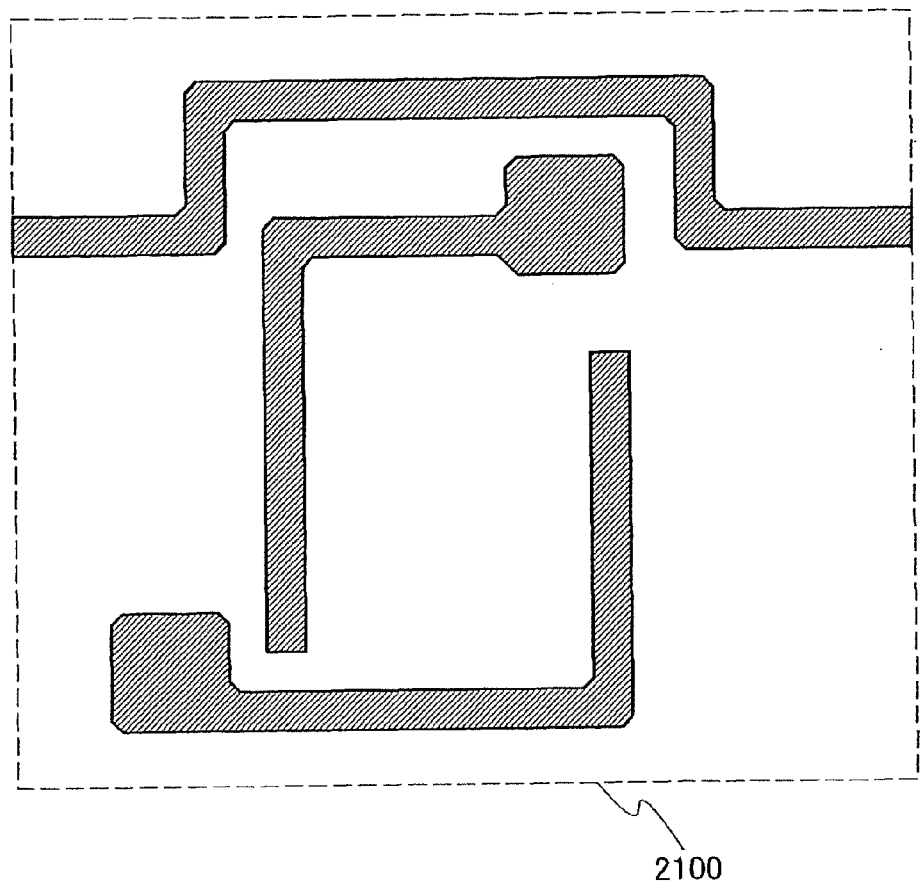

A photomask for forming the gate wiring has a mask pattern 2100 shown in FIG. 20B. The mask pattern 2100 has a pattern where a corner portion that is a right triangle in a corner portion bent into an L shape is removed so that one side of the triangle is 10 μm or less, or in the range of one-fifth to one-half of the width of the wiring, thus the corner portion thereof is rounded. In other words, the circumference of the mask pattern 2100 in the corner portion is curved when seen from above. Specifically, in order to form a round circumference of the corner portion, part of the mask pattern 2100 is removed, which corresponds to a right triangle having two first straight lines that are perpendicular to each other making the corner portion, and a second straight lines that makes an angle of about 45 degrees with the two first straight lines. When the right triangle is removed, two obtuse angles are formed in the mask pattern 2100; the mask pattern 2100 is preferably etched by appropriately adjusting the etching condition and/or the mask design so that a curved line in contact with the first straight line and the second straight line is formed in each obtuse angle portion. Note that the length of the two sides of the right triangle, which are equal to each other, is in the range of one-fifth to one-half of the width of the wiring. In addition, the inner circumference of the corner portion is also formed to be curved in accordance with the circumference of the corner portion. The shape of the mask pattern 2100 shown in FIG. 20B is reflected in the gate wirings 12, 13, and 14 shown in FIG. 20A. In this case, the homothetic shape of the mask pattern 2100 may be transferred, or may be transferred such that the corner portion of the mask pattern 2100 is more round. That is, a roundness in which the pattern shape is more rounded than in the photomask pattern 2100 may be provided. That is, respective corner portions of the gate wirings 12, 13, and 14 are provided with roundness with a size of one-fifth to one-half of the width of the wiring. Generation of fine particles due to anomalous discharge can be suppressed in a convex portion when dry etching is performed by plasma, and in a concave portion, fine particles that are likely to gather at a corner can be washed away even if the fine particles are generated at the time of cleaning. Consequently, there is an effect that improvement of the yield can be fully expected.

An interlayer insulating layer is a layer that is formed next to the gate wirings 12, 13, and 14. The interlayer insulating layer is formed of an inorganic insulating material such as silicon oxide or an organic insulating material using polyimide, acrylic resin, or the like. An insulating layer formed of silicon nitride, silicon nitride oxide, or the like may be interposed between the interlayer insulating layer and the gate wirings 12, 13, and 14. In addition, an insulating layer formed of silicon nitride, silicon nitride oxide, or the like may be provided over the interlayer insulating layer. The insulating layer can prevent the semiconductor layers and the gate insulating layer from being contaminated with impurities such as exogenous metal ion or moisture that are not good for a thin film transistor (TFT).

Figure 21A:
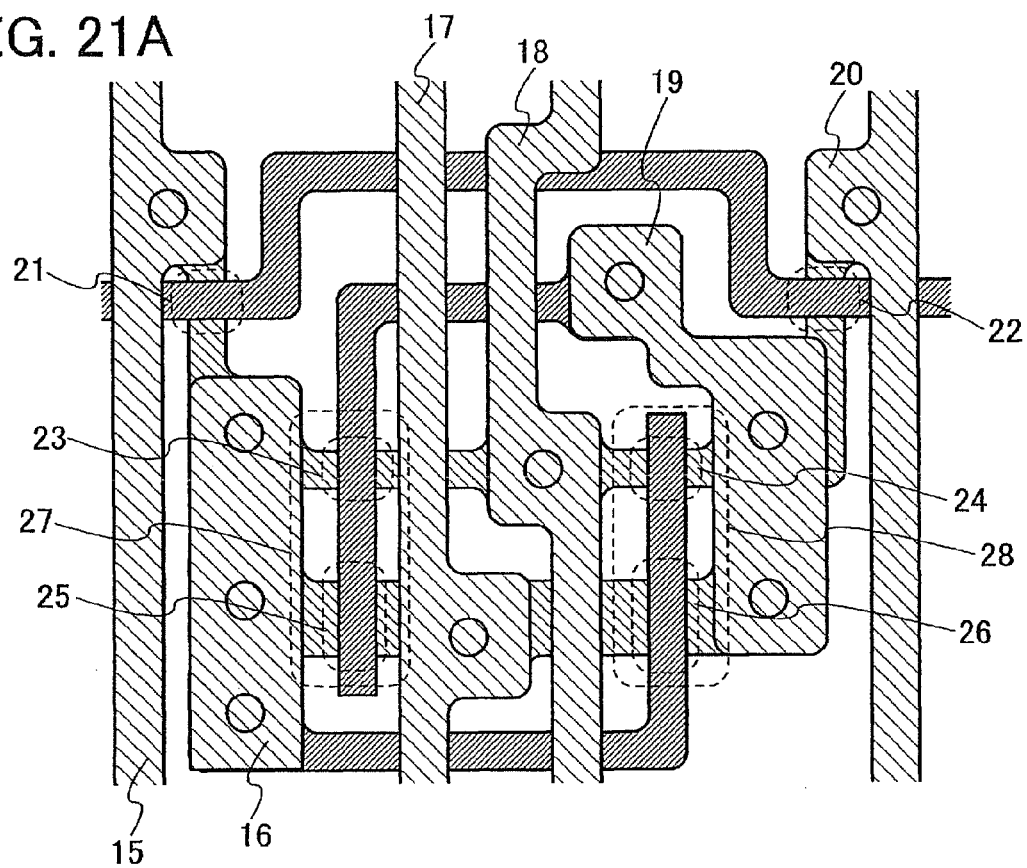
FIGS. 21A and 21B show Embodiment 4.

In the interlayer insulating layer, an opening is formed at a predetermined position. For example, it is provided corresponding to the gate wiring or the semiconductor layer which is in the lower layer. As for the wiring layer which is formed of one layer or a plurality of layers formed of a metal or a metal compound, a mask pattern is formed by photolithography technology and is formed to be a predetermined pattern by an etching process. Then, as shown in FIG. 21A, wirings 15 to 20 are formed so as to partially overlap with the semiconductor layers 10 and 11. With the wiring, predetermined elements can be connected to each other. The wiring does not connect the predetermined elements by a straight line but has a bending portion because of layout limitation. In addition, the wiring is changed in width in the contact portion or the other portion. In the contact portion, when the contact hole is equal to or larger than the wiring width, the wiring width is changed to be wider at that portion.

Figure 21B:
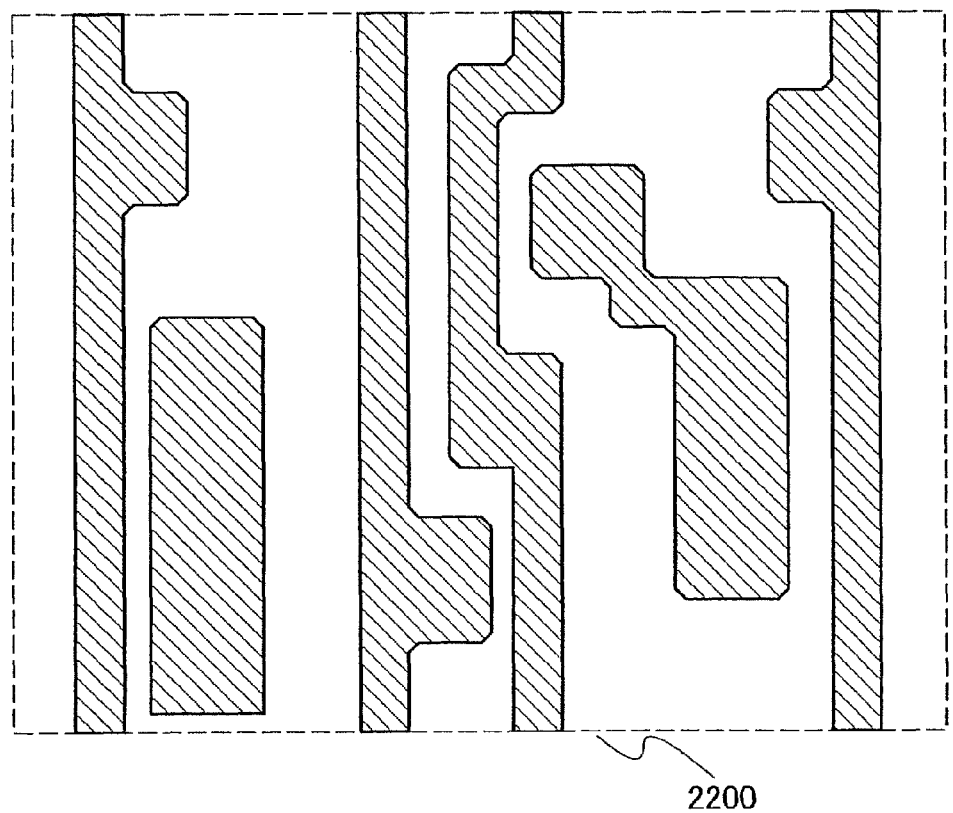

A photomask for forming the wirings 15 to 20 has a mask pattern 2200 shown in FIG. 21B. In this case also, the wiring has a pattern where a corner portion that is a right triangle in a corner portion bent into an L shape is removed so that one side of the triangle is 10 μm or less, or in the range of one-fifth to one-half of the width of the wiring, thus the corner portion thereof is rounded. In other words, the circumference of the mask pattern 2200 in the corner portion is curved when seen from above. Specifically, in order to form a round circumference of the corner portion, part of the mask pattern 2200 is removed, which corresponds to a right triangle having two first straight lines that are perpendicular to each other making the corner portion, and a second straight line that makes an angle of about 45 degrees with the two first straight lines. When the right triangle is removed, two obtuse angles are formed in the mask pattern 2200; the mask pattern 2200 is preferably etched by appropriately adjusting the etching condition and/or the mask design so that a curved line in contact with the first straight lines and the second straight line is formed in each obtuse angle portion. Note that the length of the two sides of the right triangle, which are equal to each other, is in the range of one-fifth to one-half of the width of the wiring. In addition, the inner circumference of the corner portion is also formed to be curved in accordance with the circumference of the corner portion. According to such wiring, generation of fine particles due to anomalous discharge can be suppressed in a convex portion when dry etching is performed by plasma, and in a concave portion, fine particles that are likely to gather at a corner can be washed away even if the fine particles are generated at the time of cleaning. Consequently, there is an effect that improvement of the yield can be fully expected. By providing roundness for the corner portion of the wiring, electrical conduction can be expected. In addition, in the case of a plurality of parallel wirings, it is extremely suitable in order to wash away dust.

In FIG. 21A, n-channel transistors 21 to 24 and p-channel transistors 25 and 26 are formed. Inverters 27 and 28 are structured respectively by the n-channel transistor 23 and the p-channel transistor 25, and the n-channel transistor 24 and the p-channel transistor 26 respectively. A circuit including the six transistors forms an SRAM. An insulating layer of silicon nitride, silicon oxide, or the like may be formed in a layer over these transistors.

This embodiment can be freely combined with any of the aforementioned embodiment modes and Embodiments 1 to 3.

Embodiment 5

Figure 22A:
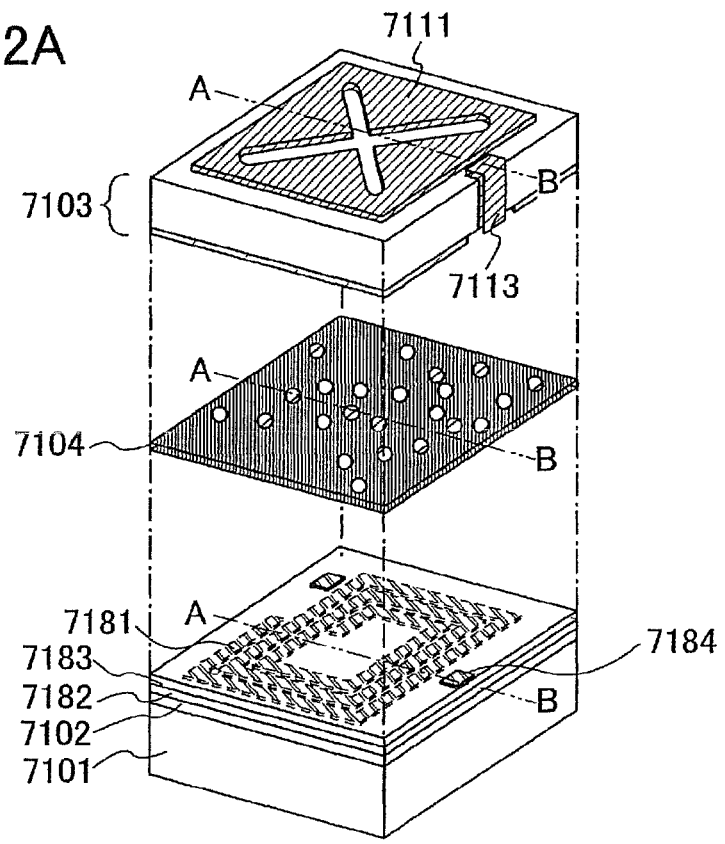
FIGS. 22A and 22B show Embodiment 5.
Figure 22B:
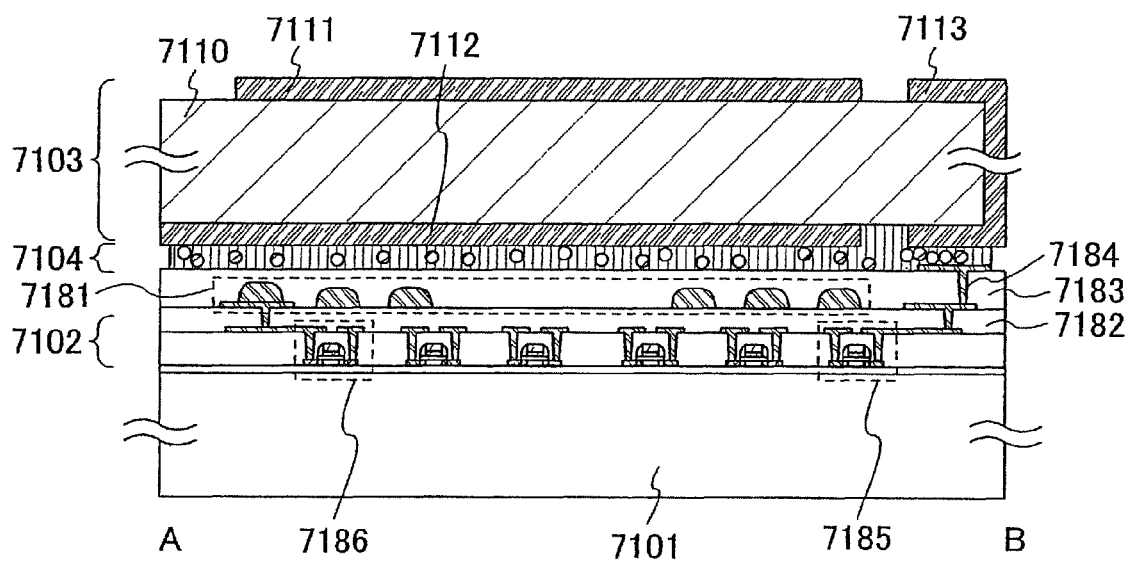

One embodiment of the semiconductor device of the invention is shown in FIGS. 22A and 22B. FIG. 22A is a development view of the semiconductor device, and FIG. 22B is a cross sectional view along a line A-B of FIG. 22A. Described in this embodiment is a structure of the semiconductor device including a plurality of antennas, particularly of the semiconductor device including an antenna formed over a layer provided with a thin film transistor, and a patch antenna.

Similarly to the method for manufacturing the element group 601 described in Embodiment 1, a layer 7102 provided with a thin film transistor is formed over an insulating substrate 7101. An interlayer insulating layer 7182 is formed over the layer 7102 provided with a thin film transistor. A first antenna 7181 is formed over the interlayer insulating layer 7182. An insulating layer 7183 is formed over the first antenna 7181, and a connecting terminal 7184 is formed on the surface of the insulating layer 7183.

The insulating layer 7183, in a part of which the connecting terminal 7184 is exposed, is attached to a patch antenna 7103 which is a second antenna with an anisotropic conductive adhesive 7104. The connecting terminal 7184 is electrically connected to a power feeding layer 7113 of the patch antenna with conductive particles dispersed in the anisotropic conductive adhesive. The connecting terminal 7184 is also electrically connected to a first thin film transistor 7185 which is formed in the layer 7102 provided with a thin film transistor. Further, the first antenna 7181 is electrically connected to a second thin film transistor 7186 which is formed in the layer 7102 provided with a thin film transistor. Note that a conductive layer that is obtained by curing a conductive paste may be used instead of the anisotropic conductive adhesive.

The first antenna 7181 is formed of a metal material containing aluminum, copper, or silver. For example, composition of copper or silver paste can be formed by a printing method such as screen printing, offset printing, and ink-jet printing. Alternatively, an aluminum film may be formed by sputtering or the like and processed by etching. The first antenna 7181 may also be formed by electrolytic plating or electroless plating.

The patch antenna 7103 has a dielectric layer 7110, a first conductive layer 7111 formed on one surface of the dielectric layer 7110, a second conductive layer 7112 which is formed on another surface of the dielectric layer 7110 and which opposes to the first conductive layer 7111 through the dielectric layer 7110, and a power feeding layer 7113. The first conductive layer 7111 serves as a radiating electrode. The second conductive layer 7112 serves as a ground contact body. The power feeding layer 7113 is provided so as not to contact the first conductive layer 7111 and the second conductive layer 7112.

Note that the first antenna 7181 can be omitted.

Figure 23A:
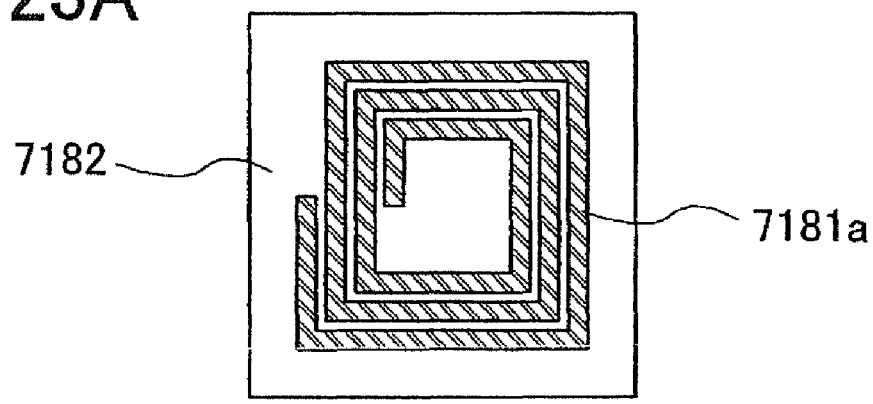
FIGS. 23A to 23C show Embodiment 5.

Here, the first antenna 7181 has a shape of a square coil as shown in FIG. 23A.

Figure 23B:
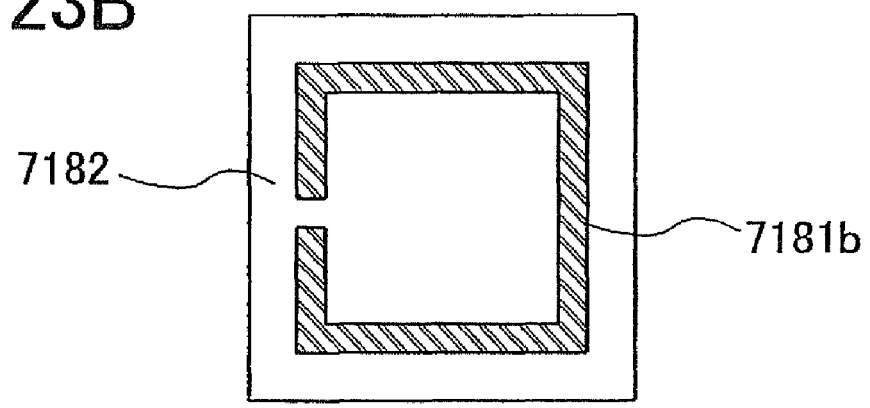
Figure 23C:
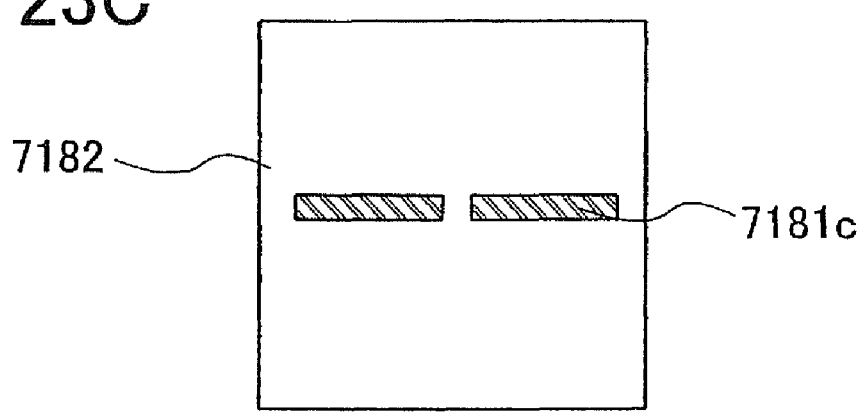

The shape of the first antenna 7181 is described with reference to FIGS. 23A to 23C. FIGS. 23A to 23C are top views showing the interlayer insulating layer 7182 and the antenna formed thereover. Although the first antenna 7181 has a square coil shape 7181a as shown in FIG. 22A and FIG. 23A in this embodiment, the shape is not limited to this. The antenna may have a circular coil shape. Alternatively, as shown in FIG. 23B, the antenna may have a square loop shape 7181b. The antenna may also have a circular loop shape. Furthermore, as shown in FIG. 23C, the antenna may have a linear-dipole shape 7181c. Moreover, the antenna may also have a curved-dipole shape.

By thus providing a plurality of antennas, a multiband semiconductor device that is capable of receiving electric waves having different frequencies can be formed.

This embodiment can be freely combined with the aforementioned embodiment modes and Embodiments 1 to 4.

Embodiment 6

In this embodiment, applications of the semiconductor device of the invention (which corresponds to the wireless chip 1000 in FIG. 10) are described with reference to FIGS. 15A and 15B and FIGS. 16A to 16E. The wireless chip 1000 can be provided for, for example, bills, coins, securities, bearer bonds, certificates (e.g., driving license or resident card, see FIG. 16A), containers for wrapping objects (e.g., wrapping paper or bottle, see FIG. 16B), recording media such as DVDs, CDs, and video tapes (see FIG. 16C), vehicles such as cars, motorbikes, and bicycles (see FIG. 16D), personal belongings such as bags and glasses (see FIG. 16E), foods, clothes, commodities, or electronic apparatuses. The electronic apparatuses include a liquid crystal display device, an EL (electroluminescence) display device, a television set (also simply called a television or a television receiver), a mobile phone set, and the like.

The wireless chip 1000 can be fixed to an object by being attached to the surface of the object or embedded in the object For example, the wireless chip 1000 may be embedded in paper of a book, or organic resin of a package. By providing the wireless chip 1000 for bills, coins, securities, bearer bonds, certificates, and the like, forgery thereof can be prevented Further, by providing the wireless chip 1000 for containers for wrapping objects, recording media, personal belongings, foods, clothes, commodities, electronic apparatuses, and the like, inspection system, rental system, and the like can be performed more efficiently. The wireless chip 1000 can also prevent vehicles from being forged or stolen. In addition, by implanting the wireless chip 1000 into creatures such as animals, each creature can be identified easily. For example, by implanting the wireless chip 1000 into creatures such as domestic animals, the year of birth, sex, breed, and the like thereof can be identified easily.

As set forth above, the wireless chip 1000 of the invention can be provided for any object (including creatures).

The wireless chip 1000 has various advantages such that data can be transmitted and received through wireless communication, processing into various shapes can be performed, and wide directivity and recognition range are achieved depending on a selected frequency.

Next, one mode of a system using the wireless chip 1000 is described with reference to FIGS. 15A and 15B. A reader/writer 9520 is provided on a side of a portable terminal including a display portion 9521, a semiconductor device 9523 (the wireless chip 1000 in FIG. 10) of the invention is provided on a side of an object A 9522, and a semiconductor device 9531 of the invention is provided on a side of an object B 9532 (see FIG. 15A). When the reader/writer 9520 is brought close to the semiconductor device 9523 included in the object A 9522, information on the object A 9522, such as ingredients, place of origin, test result in each production step, history of the distribution process, and explanation of the object is displayed on the display portion 9521. When the reader/writer 9520 is brought close to the semiconductor device 9531 included in the object B 9532, information on the object B 9532, such as ingredients, place of origin, test result in each production step, history of the distribution process, and explanation of the object is displayed on the display portion 9521.

Figure 15A:
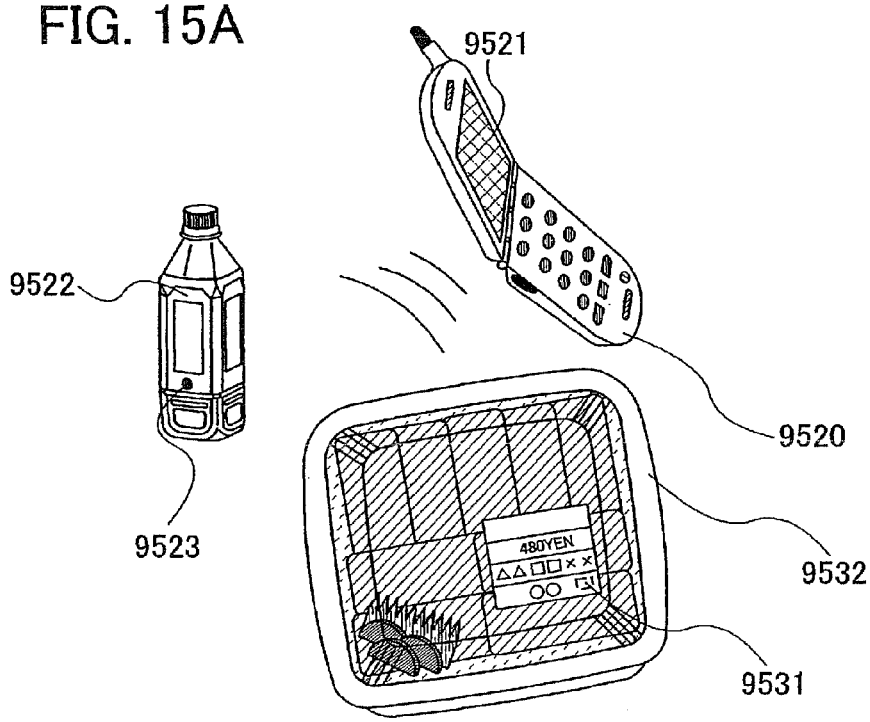
FIGS. 15A and 15B show Embodiment 6.
Figure 15B:
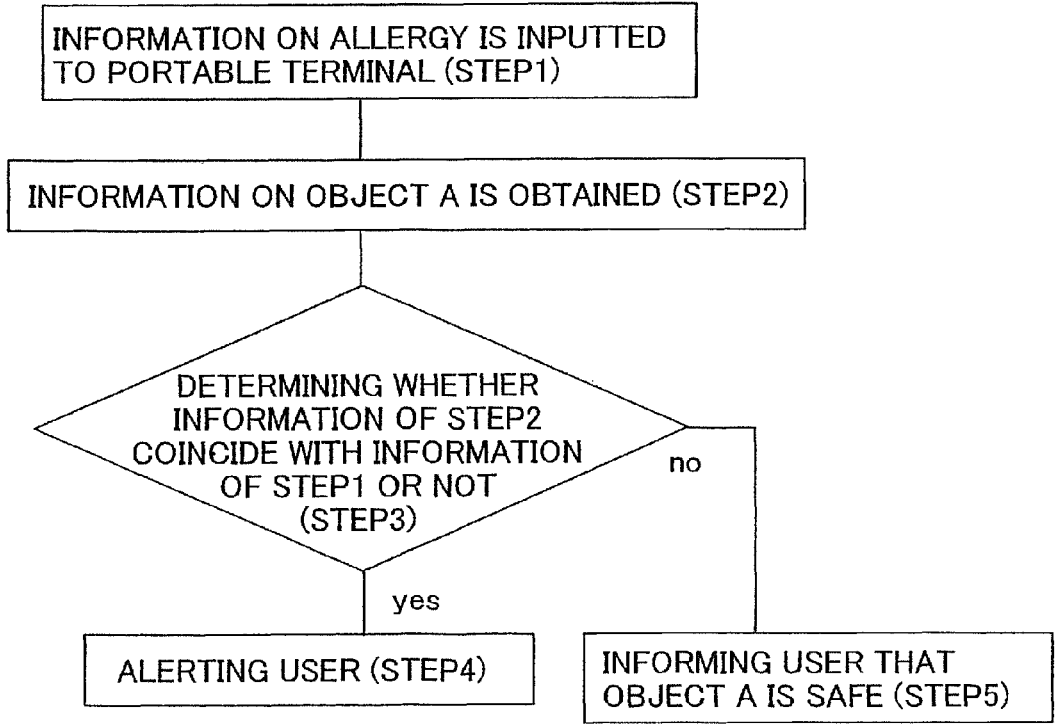
Figure 16A:
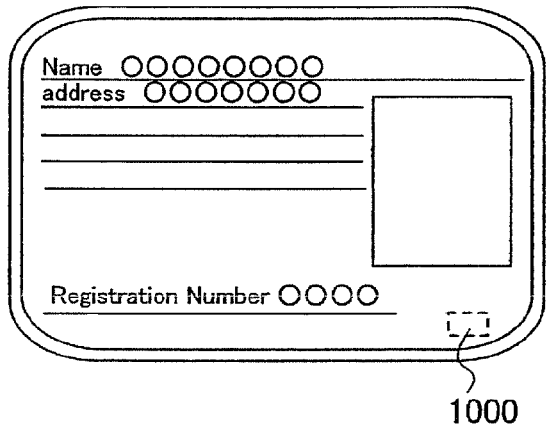
FIGS. 16A to 16E show Embodiment 6.
Figure 16B:
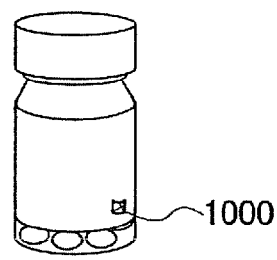
Figure 16C:
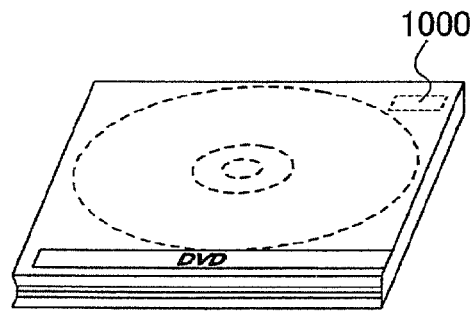
Figure 16D:
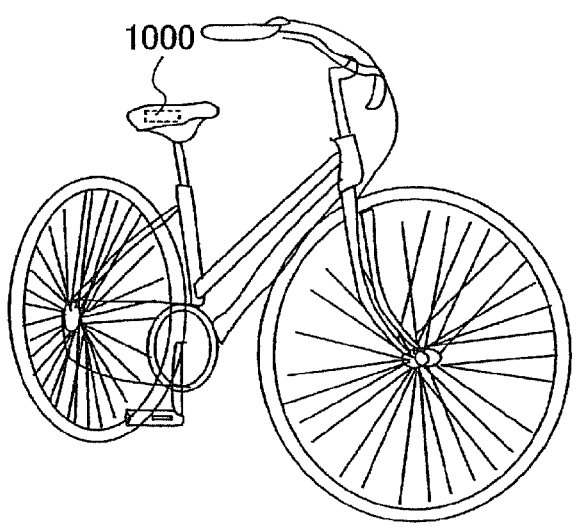
Figure 16E:
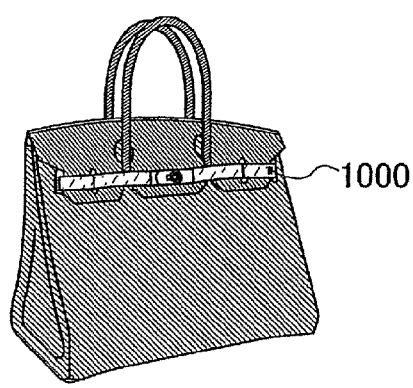

An example of a business model utilizing the system shown in FIG. 15A is described with reference to a flow chart shown in FIG. 15B. Information on allergy is inputted to a portable terminal (step 1). The information on allergy is information on medicine and ingredients or the like thereof that may cause allergic reactions to certain people. As described above, the information on the object A 9522 is obtained by the reader/writer 9520 provided for the portable terminal (step 2). Here, the object A 9522 is medicine. The information on the object A 9522 includes information on the ingredients of the object A 9522. The information on allergy is compared to the obtained information on the object A 9522, thereby determining whether they coincide with each other or not (step 3). If they coincide with each other, the user of the portable terminal is alerted that the certain people may have allergic reactions to the object A (step 4). If they do not coincide with each other, the user of the portable terminal is informed of that the certain people are at low risk of having allergic reactions to the object A (the fact that the object A is safe) (step 5). In the step 4 and the step 5, in order to inform the user of the portable terminal of the information, the information may be displayed on the display portion 9521 of the portable terminal, or an alarm of the portable terminal or the like may be sounded.

Another example of the business model is shown in FIG. 15A is as follows. Information on combination (hereinafter, referred to as combination information) of medicines that are dangerous when used together or combination of ingredients that are dangerous when used together is inputted to a terminal (step 1). As described above, the information on the object A is obtained by the reader/writer provided for the terminal (step 2). Here, the object A is medicine. The information on the object A includes information on ingredients or the like of the object A. Then, as described above, the information on the object B is obtained by the reader/writer provided for the terminal (step 2'). Here, the object B is also medicine. The information on the object B also includes information on ingredients or the like of the object B. In this manner, information on a plurality of medicines is obtained. The combination information is compared to the obtained information on the plurality of medicines, thereby determining whether they coincide with each other or not (step 3). That is, determining whether there is combination of ingredients of medicines that are dangerous when used together or not If they coincide with each other, the user of the portable terminal is alerted (step 4). If they do not coincide with each other, the user of the portable terminal is informed this (the fact it is safe) (step 5). In the step 4 and the step 5, in order to inform the user of the terminal of the information, the information may be displayed on the display portion of the terminal, or an alarm of the portable terminal or the like may be sounded.

As described above, by utilizing the semiconductor device of the invention in a system, information can be obtained easily and a system with high function and high added value can be provided.

This embodiment can be freely combined with the aforementioned embodiment modes and Embodiments 1 to 5.

Embodiment 7

This embodiment describes an example of the system utilizing the wireless chip 1000, which is different from the example described in Embodiment 6.

For example, membership cards provided with the wireless chips 1000 are distributed, and merchandize displayed inside a store is also provided with the wireless chips 1000. When a customer who takes along the membership card provided with the wireless chip 1000 walks inside the store while having the merchandise provided with the wireless chip 1000, a plurality of readers/writers disposed in the store communicate with the two wireless chips 1000 so that information of the two wireless chips 1000 is obtained. In this manner, appropriate information with respect to combination of the information of the two wireless chips 1000 is provided for the customer.

The information can be provided by any means such as sound or an image. Further, the number of wireless chips for communication is not limited to two.

For example, in the case where there is a plurality of patterns of merchandise purchase of a customer, merchandize to be purchased may be predicted from information of one or a plural pieces of merchandize which are purchased to provide information, so that eagerness to buy can be challenged.

By grasping a traveling pattern of a customer by the reader/writer provided in plural numbers inside the shop, information can be provided in accordance with a place in the shop.

By various reaction of the reader/writer to a person (an object) by an object (a person) that is a key (a condition) or by information of time and place that is a key (a condition), an appropriate service can be performed.

As described above, by utilizing the semiconductor device of the invention in a system, information can be obtained easily and a system with high function and high added value can be provided.

This embodiment can be freely combined with the aforementioned embodiment modes and Embodiments 1 to 6.

What is claimed is:

1. A semiconductor device comprising:
   a control portion including a first transistor, a second transistor and a third transistor;
   a current source portion electrically connected to the control portion; and
   an oscillator circuit electrically connected to the current source portion,
   wherein the control portion is configured to change an output voltage in accordance with a change of a power supply voltage to be applied to the control portion,
   wherein a drain of the first transistor and a drain of the third transistor are electrically connected to each other,
   wherein a drain of the second transistor and the drain of the third transistor are electrically connected to each other,
   wherein the third transistor is diode-connected, and
   wherein a gate voltage of the second transistor is decreased when the power supply voltage is increased, whereas the gate voltage of the second transistor is increased when the power supply voltage is decreased.

2. The semiconductor device according to claim 1, wherein the second transistor is an n-channel transistor.

3. The semiconductor device according to claim 1, wherein a drain current of the third transistor is a sum of a drain current of the first transistor and a drain current of the second transistor.

4. The semiconductor device according to claim 1, wherein the output voltage is output from the drain of the first transistor.

5. The semiconductor device according to claim 1, wherein the output voltage is input to the current source portion.

6. The semiconductor device according to claim 1, wherein the control portion decreases the output voltage when the power supply voltage is increased, whereas the control portion increases the output voltage when the power supply voltage is decreased.

7. The semiconductor device according to claim 1, wherein the second transistor forms a constant current source of supplying a constant current in accordance with the gate voltage.

8. A semiconductor device comprising:
   a control portion including a first transistor, a second transistor and a third transistor;
   a current source portion electrically connected to the control portion; and
   an oscillator circuit electrically connected to the current source portion,
   wherein the control portion is configured to change an output voltage in accordance with a change of a power supply voltage to be applied to the control portion,
   wherein a drain of the first transistor and a drain of the third transistor are electrically connected to each other,
   wherein a drain of the second transistor and the drain of the third transistor are electrically connected to each other,
   wherein the third transistor is diode-connected,
   wherein the first transistor and the second transistor are p-channel transistors,
   wherein a gate voltage of the second transistor changes so as to decrease a drain current of the second transistor when the power supply voltage is increased, whereas the gate voltage of the second transistor changes so as to increase the drain current of the second transistor when the power supply voltage is decreased, and
   wherein the control portion decreases the output voltage when the power supply voltage is increased, whereas the control portion increases the output voltage when the power supply voltage is decreased.

9. The semiconductor device according to claim 8, wherein a drain current of the third transistor is a sum of a drain current of the first transistor and a drain current of the second transistor.

10. The semiconductor device according to claim 8, wherein the output voltage is output from the drain of the first transistor.

11. The semiconductor device according to claim 8, wherein the output voltage is input to the current source portion.

12. The semiconductor device according to claim 8, wherein the second transistor forms a constant current source of supplying a constant current in accordance with the gate voltage.

13. A semiconductor device comprising:

a control portion including a first transistor, a second transistor, a third transistor, a fourth transistor and a fifth transistor;

a current source portion electrically connected to the control portion; and an oscillator circuit electrically connected to the current source portion, wherein the control portion is configured to change an output voltage in accordance with a change of a power supply voltage to be applied to the control portion, wherein a drain of the first transistor and a drain of the third transistor are electrically connected to each other, wherein a drain of the second transistor and the drain of the third transistor are electrically connected to each other, wherein the third transistor is diode-connected, wherein the third transistor and the fourth transistor form a current mirror circuit, wherein the fifth transistor is diode-connected, and wherein a gate voltage of the second transistor is decreased when the power supply voltage is increased, whereas the gate voltage of the second transistor is increased when the power supply voltage is decreased.

14. The semiconductor device according to claim 13, wherein the second transistor is an n-channel transistor.

15. The semiconductor device according to claim 13, wherein a drain current of the third transistor is a sum of a drain current of the first transistor and a drain current of the second transistor.

16. The semiconductor device according to claim 13, wherein the output voltage is output from the drain of the first transistor.

17. The semiconductor device according to claim 13, wherein the output voltage is input to the current source portion.

18. The semiconductor device according to claim 13, wherein the control portion decreases the output voltage when the power supply voltage is increased, whereas the control portion increases the output voltage when the power supply voltage is decreased.

19. The semiconductor device according to claim 13, wherein the second transistor forms a constant current source of supplying a constant current in accordance with the gate voltage.

* * * * *